(12) United States Patent
Ko

(10) Patent No.: US 11,810,829 B2
(45) Date of Patent: Nov. 7, 2023

(54) APPARATUS FOR INSPECTING LIGHT EMITTING ELEMENTS, METHOD OF INSPECTING LIGHT EMITTING ELEMENTS USING THE APPARATUS, AND METHOD OF MANUFACTURING DISPLAY DEVICE USING THE APPARATUS

(71) Applicant: Samsung Display Co., Ltd., Yongin-si (KR)

(72) Inventor: Seung Cheol Ko, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 282 days.

(21) Appl. No.: 17/301,503

(22) Filed: Apr. 5, 2021

(65) Prior Publication Data
US 2021/0384084 A1    Dec. 9, 2021

(30) Foreign Application Priority Data
Jun. 8, 2020 (KR) .................. 10-2020-0069189

(51) Int. Cl.
*H01L 21/66* (2006.01)
*H01L 33/00* (2010.01)

(52) U.S. Cl.
CPC .............. *H01L 22/10* (2013.01); *H01L 22/24* (2013.01); *H01L 33/0095* (2013.01)

(58) Field of Classification Search
CPC ..... H01L 22/10; H01L 22/24; H01L 33/0095; H01L 33/20; H01L 2224/95; H01L 24/00; H01L 25/0753; H01L 22/34; H01L 27/156; G06T 7/0002; G06T 7/11; G06T 2207/30121; G01M 11/02; G02F 1/1309
See application file for complete search history.

(56) References Cited

U.S. PATENT DOCUMENTS

| 9,651,608 | B2 * | 5/2017 | Yoshida | ................. H05B 45/50 |
| 2015/0357250 | A1 * | 12/2015 | Kim | ..................... H01L 33/486 438/7 |
| 2017/0356852 | A1 * | 12/2017 | Hotta | ................. G01N 21/8903 |
| 2020/0152835 | A1 | 5/2020 | Ko et al. | |

FOREIGN PATENT DOCUMENTS

CN   111162093 A   5/2020

* cited by examiner

*Primary Examiner* — Jermele M Hollington
*Assistant Examiner* — Zannatul Ferdous
(74) *Attorney, Agent, or Firm* — Lewis Roca Rothgerber Christie LLP

(57) ABSTRACT

An apparatus for inspecting light emitting elements, a method of inspecting light emitting elements using the apparatus, and a method of manufacturing display device using the apparatus are provided. The apparatus includes a flow path unit extending in one direction and including a flow path along which a solution in which light emitting elements are mixed moves, at least one alignment unit to which the flow path extends from at least a portion of the flow path unit, a packaging unit at an end of the flow path unit and in which the light emitting elements are stacked, and a plurality of alignment electrodes on an outer surface of the alignment unit.

19 Claims, 22 Drawing Sheets

APPARATUS FOR INSPECTING LIGHT
EMITTING ELEMENTS, METHOD OF
INSPECTING LIGHT EMITTING ELEMENTS
USING THE APPARATUS, AND METHOD OF
MANUFACTURING DISPLAY DEVICE
USING THE APPARATUS

CROSS-REFERENCE TO RELATED
APPLICATION

This application claims priority to and the benefit of Korean Patent Application No. 10-2020-0069189 filed on Jun. 8, 2020, in the Korean Intellectual Property Office, the entire content of which is hereby incorporated by reference.

BACKGROUND

1. Field

Embodiments the present disclosure relate to an apparatus for inspecting light emitting elements, a method of inspecting light emitting elements using the apparatus, and a method of manufacturing a display device using the apparatus.

2. Description of the Related Art

Display devices are becoming increasingly important with the development of multimedia. Accordingly, various types (or kinds) of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a fluorescent material or may be inorganic LEDs using an inorganic material as the fluorescent material.

The above-described light emitting elements may be put into a solution mixed with a solvent and then transferred or printed on a substrate. However, defects of the light emitting elements themselves causes a reduction in the luminance of pixels of a display device.

SUMMARY

Aspects of embodiments of the present disclosure provide an apparatus for inspecting light emitting elements for defects.

Aspects of embodiments of the present disclosure also provide a method of manufacturing a display device with reduced defects by excluding defective light emitting elements (or by reducing the number of defective light emitting elements).

However, aspects of embodiments of the disclosure are not restricted to the ones set forth herein. The above and other aspects of embodiments of the disclosure will become more apparent to one of ordinary skill in the art to which the disclosure pertains by referencing the detailed description of the disclosure given below.

According to an aspect of an embodiment of the disclosure, there is provided an apparatus for inspecting light emitting elements, the apparatus including a flow path unit extending in one direction and including a flow path along which a solution in which the light emitting elements are mixed moves, at least one alignment unit to which the flow path extends from at least a portion of the flow path unit, a packaging unit at an end of the flow path unit and in which the light emitting elements are stacked, and a plurality of alignment electrodes on an outer surface of the alignment unit.

In an embodiment, the flow path unit includes an inlet at an upper end of the flow path unit and an outlet at a lower end of the flow path unit, and each of the inlet and the outlet has a rectangular planar shape.

In an embodiment, a planar shape of the flow path is the same (e.g., substantially the same) as the planar shape of the inlet or the outlet.

In an embodiment, the alignment unit includes a first alignment area and a second alignment area, and the first alignment area and the second alignment area are spaced apart from each other in the one direction.

In an embodiment, a diameter of the first alignment area or the second alignment area is greater than a length of a long axis of each of the light emitting elements.

In an embodiment, wherein the packaging unit includes a storage part which extends from the flow path unit, a plurality of inspection electrodes which are on two sides inside the storage part, filtering shutters at upper and lower ends of the storage part, respectively, and electrode moving parts outside the flow path unit and move the inspection electrodes.

In an embodiment, the inspection electrodes are spaced apart from the alignment electrodes.

In an embodiment, the filtering shutters include a first filtering shutter at the upper end of the storage part and a second filtering shutter at the lower end of the storage part, and the first filtering shutter and the second filtering shutter open or close the upper end and the lower end of the storage part, respectively.

According to an embodiment of the disclosure, there is provided a method of inspecting light emitting elements using an apparatus for inspecting the light emitting elements, the apparatus including a flow path unit extending in one direction and including a flow path, at least one alignment unit to which the flow path extends from at least a portion of the flow path unit, a packaging unit at an end of the flow path unit and in which light emitting elements are stacked and a plurality of alignment electrodes on an outer surface of the alignment unit, and the method including preparing a solution in which the light emitting elements and a solvent are mixed, sorting the light emitting elements by length, injecting the solution into the inspection apparatus and aligning the light emitting elements using the alignment unit, aligning the aligned light emitting elements using the packaging unit, and determining whether the light emitting elements are defective by inspecting resistances and luminances of the light emitting elements.

In an embodiment, light emitting elements having a set length are sorted out using a surface acoustic wave technique.

In an embodiment, the length of each of the light emitting elements is in a range of 3.8 to 4.2 μm.

In an embodiment, surface acoustic waves have a frequency band in a range of 165 to 175 MHz.

In an embodiment, the alignment unit rotates and aligns the light emitting elements by applying an electrical signal to the alignment electrodes to generate an electric field.

In an embodiment, the packaging unit includes a plurality of inspection electrodes and electrode moving parts which horizontally move the inspection electrodes, and the inspection electrodes are brought into contact with both sides of each light emitting element aligned in the packaging unit by the electrode moving parts to measure the resistances and luminances of the light emitting elements.

In an embodiment, the light emitting elements are obtained when the light emitting elements are determined to be non-defective in resistance and luminance, and the light emitting elements are re-injected into the solution when the light emitting elements are determined to be defective in resistance or luminance.

In an embodiment, the light emitting elements re-injected into the solution are mixed again using the surface acoustic wave technique.

In an embodiment, the solution in which the re-injected light emitting elements are mixed repeat the sorting of the light emitting elements by length, the injecting of the solution into the inspection apparatus and the aligning of the light emitting elements using the alignment unit, the aligning of the aligned light emitting elements using the packaging unit, and the determining of whether the light emitting elements are defective by inspecting the resistances and luminances of the light emitting elements.

According to an embodiment of the disclosure, there is provided a method of manufacturing a display device using an apparatus for inspecting light emitting elements, the apparatus including a flow path unit extending in one direction and including a flow path and extends in one direction, at least one alignment unit to which the flow path extends from at least a portion of the flow path unit, a packaging unit which is at an end of the flow path unit and in which light emitting elements are stacked and a plurality of alignment electrodes on an outer surface of the alignment unit, and the method including preparing a solution in which the light emitting elements and a solvent are mixed, sorting the light emitting elements by length, injecting the solution into the inspection apparatus and aligning the light emitting elements using the alignment unit, aligning the aligned light emitting elements using the packaging unit, determining whether the light emitting elements are defective by inspecting resistances and luminances of the light emitting elements and obtaining light emitting elements determined to be non-defective, preparing an ink by mixing the light emitting elements determined to be non-defective with the solvent, coating the ink on a target substrate including a plurality of subpixels and aligning the light emitting elements, and forming a plurality of contact electrodes on the light emitting elements.

In an embodiment, the aligning of the light emitting elements includes forming a first electrode layer and a second electrode layer on the target substrate, coating the ink on the target substrate using an inkjet printing device, and aligning the light emitting elements by generating an electric field on the target substrate.

In an embodiment, the forming of the contact electrodes on the light emitting elements includes forming a first insulating layer on the target substrate, and forming a first contact electrode and a second contact electrode which respectively contact both ends of each light emitting element.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Embodiments of the present disclosure will now be described more fully hereinafter with reference to the accompanying drawings, in which example embodiments of the present disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Each of the features of the various embodiments of the present disclosure may be combined with each other, in part or in whole, and technically various interlocking and driving configurations are possible. Each embodiment may be implemented independently of each other or may be implemented together in an association.

Hereinafter, certain embodiments will be described with reference to the attached drawings.

Figure 1:
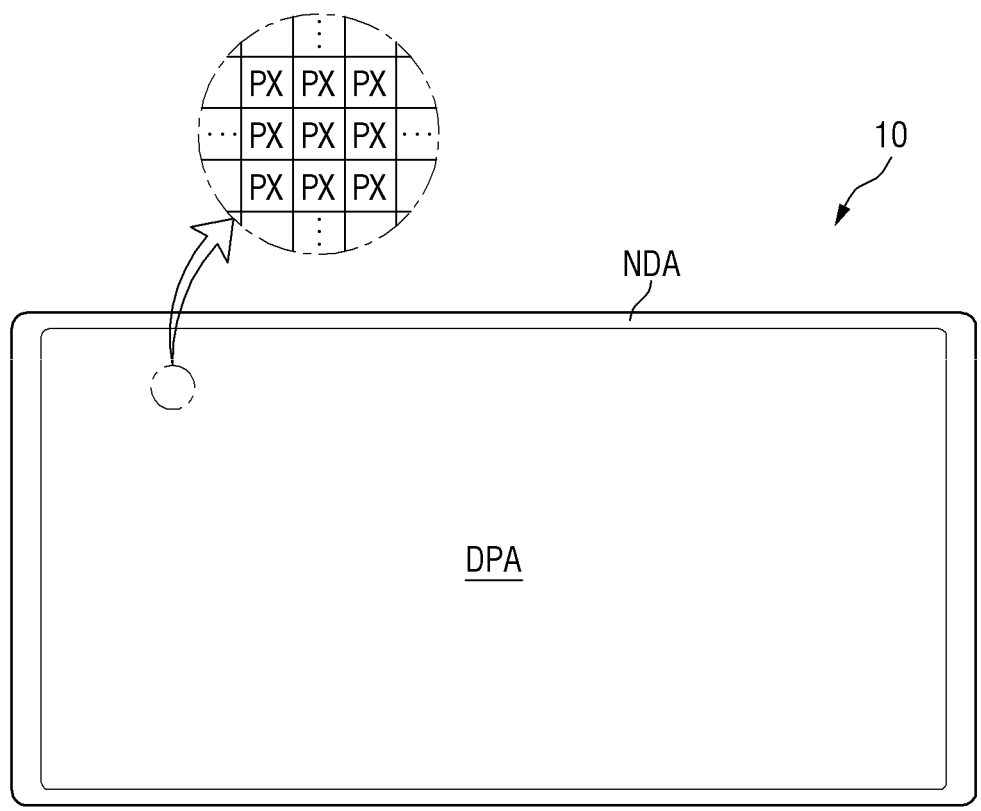
FIG. 1 is a schematic plan view of a display device according to an embodiment.

FIG. 1 is a schematic plan view of a display device according to an embodiment.

Referring to FIG. 1, the display device 10 displays moving images or still images. The display device 10 may refer to any suitable electronic device that provides or has a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, and/or camcorders, all of which provide or have a display screen.

The display device 10 includes a display panel that provides a display screen. Examples of the display panel include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels can also be applied as long as the same technical spirit is applicable.

The shape of the display device 10 can be variously modified. For example, the display device 10 may have various suitable shapes such as a horizontally long rectangle, a vertically long rectangle, a square, a quadrangle with rounded corners (vertices), other polygons, or a circle. The shape of a display area DPA of the display device 10 may also be similar to (e.g., correspond with) the overall shape of the display device 10. In FIG. 1, each of the display device 10 and the display area DPA is shaped like a horizontally long rectangle.

The display device 10 may include the display area DPA and a non-display area NDA. The display area DPA may be an area where a screen (or an image) can be displayed, and the non-display area NDA may be an area where no screen (or image) is displayed (e.g., the non-display area NDA may be an area that is not designed to display an image). The display area DPA may also be referred to as an active area, and the non-display area NDA may also be referred to as an inactive area. The display area DPA may generally occupy a center of the display device 10.

The display area DPA may include a plurality of pixels PX. The pixels PX may be arranged in a matrix direction. Each of the pixels PX may be rectangular or square in a plan view. However, the disclosure is not limited thereto, and each of the pixels PX may also have a rhombic planar shape having each side inclined with respect to a direction. The pixels PX may be alternately arranged in a stripe pattern or a PENTILE® pattern (PENTILE® is a registered trademark of Samsung Display Co., Ltd.). In addition, each of the pixels PX may include one or more light emitting elements which emit light of a set or specific wavelength band to display a set or specific color.

The non-display area NDA may be around the display area DPA (e.g., may at least partially surround the display area DPA). The non-display area NDA may entirely or partially surround the display area DPA. The display area DPA may be rectangular, and the non-display area NDA may be adjacent to four sides of the display area DPA. The non-display area NDA may form a bezel of the display device 10. Wirings or circuit drivers included in the display device 10 may be provided, or external devices may be mounted, in each non-display area NDA.

Figure 2:
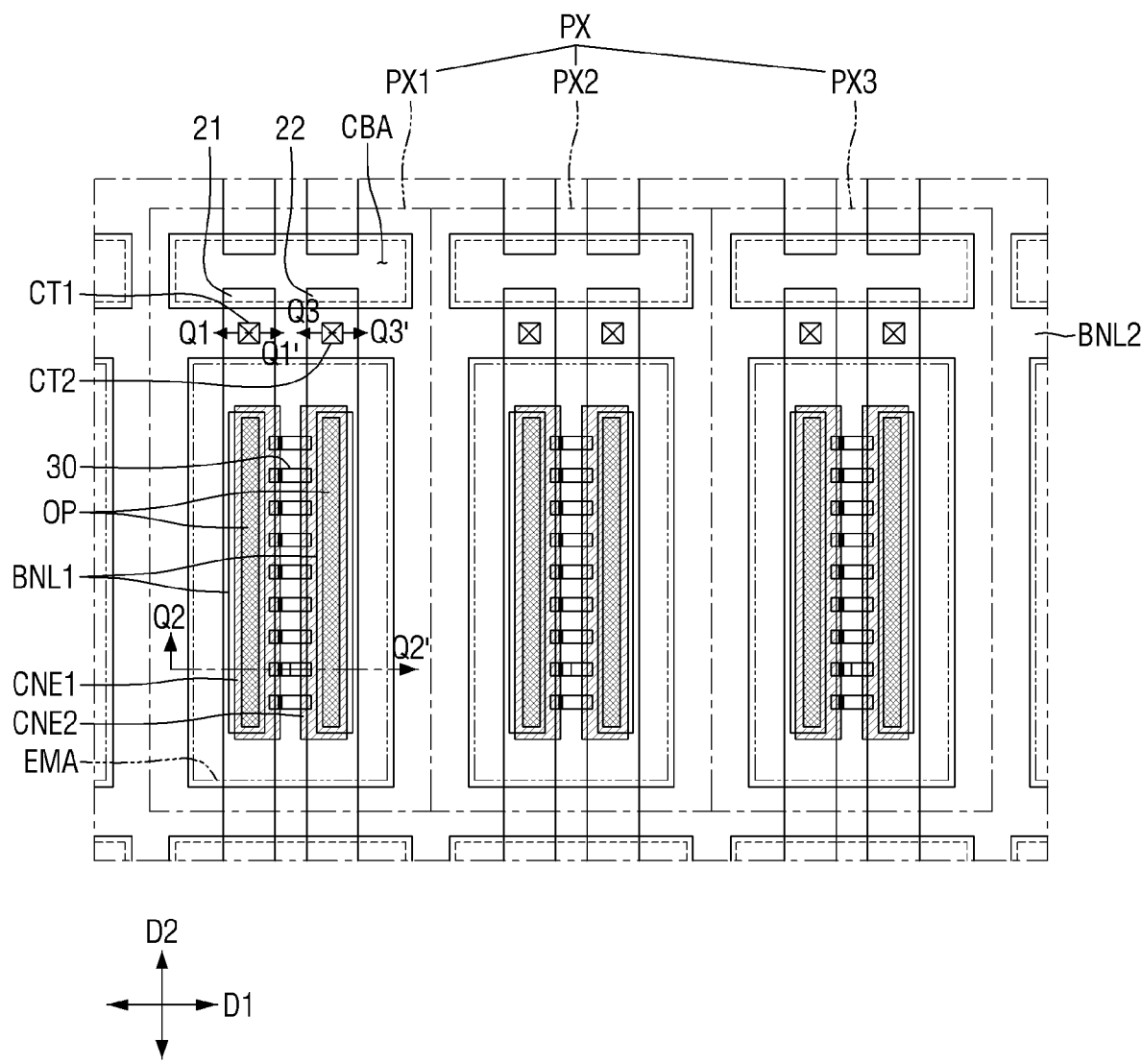
FIG. 2 is a plan view of a pixel of the display device according to the embodiment.

FIG. 2 is a plan view of a pixel PX of the display device 10 according to the embodiment.

Referring to FIG. 2, each of a plurality of pixels PX may include a plurality of subpixels PXn (where n is an integer of 1 to 3). For example, one pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. For example, the first color may be blue, the second color may be green, and the third color may be red. However, the disclosure is not limited thereto, and the subpixels PXn may also emit light of the same (e.g., substantially the same) color. In addition, although one pixel PX includes three subpixels PXn in FIG. 2, the disclosure is not limited thereto, and the pixel PX may also include additional subpixels PXn.

Each subpixel PXn of the display device 10 may include an emission area EMA and a non-emission area. The emission area EMA may be an area in which light emitting elements 30 are provided to output light of a set or specific wavelength band, and the non-emission area may be an area in which the light emitting elements 30 are not included and from which no (or substantially no) light is output because light emitted from the light emitting elements 30 does not reach this area (or substantially does not reach this area). The emission area EMA may include an area where the light emitting elements 30 are provided and where light emitted from the light emitting elements 30 is output to an area adjacent to the light emitting elements 30.

However, the disclosure is not limited thereto, and the emission area EMA may also include an area from which light emitted from the light emitting elements 30 is output after being reflected or refracted by other members of the display device. A plurality of light emitting elements 30 may be in each subpixel PXn, and an area where the light emitting elements 30 are provided and an area adjacent to this area may form the emission area EMA.

In the emission area EMA, contact electrodes CNE1 and CNE2 may be disposed to respectively overlap electrodes 21 and 22 and to contact (e.g., physically contact) a side and the other side of each light emitting element 30. The contact electrodes CNE1 and CNE2 may be coupled to the electrodes 21 and 22 through openings OP, respectively. The structures of the electrodes 21 and 22 and the contact electrodes CNE1 and CNE2 will be further described herein below.

In addition, each subpixel PXn may include a cut area CBA in the non-emission area. The cut area CBA may be on a side of the emission area EMA in a second direction D2.

The cut area CBA may be between the emission areas EMA of subpixels PXn neighboring each other in the second direction D2. A plurality of emission areas EMA and a plurality of cut areas CBA may be arranged in the display area DPA of the display device 10. For example, the emission areas EMA and the cut areas CBA may be repeatedly arranged in a first direction D1 and, at the same time, may be alternately arranged in the second direction D2. In addition, a gap between the cut areas CBA in the first direction D1 may be smaller than a gap between the emission areas EMA in the first direction D1. A second bank BNL2 may be between the cut areas CBA and the emission areas EMA, and a gap between the cut areas CBA and the emission areas EMA may vary according to a width of the second bank BNL2. Light may not be output (or substantially may not be output) from the cut areas CBA because the light emitting elements 30 are not in the cut areas CBA, but a portion of each of the electrodes 21 and 22 in each subpixel PXn may be in the cut area CBA. The electrodes 21 and 22 in each subpixel PXn may be separated (e.g., spaced apart) from each other in the cut area CBA.

Figure 3:
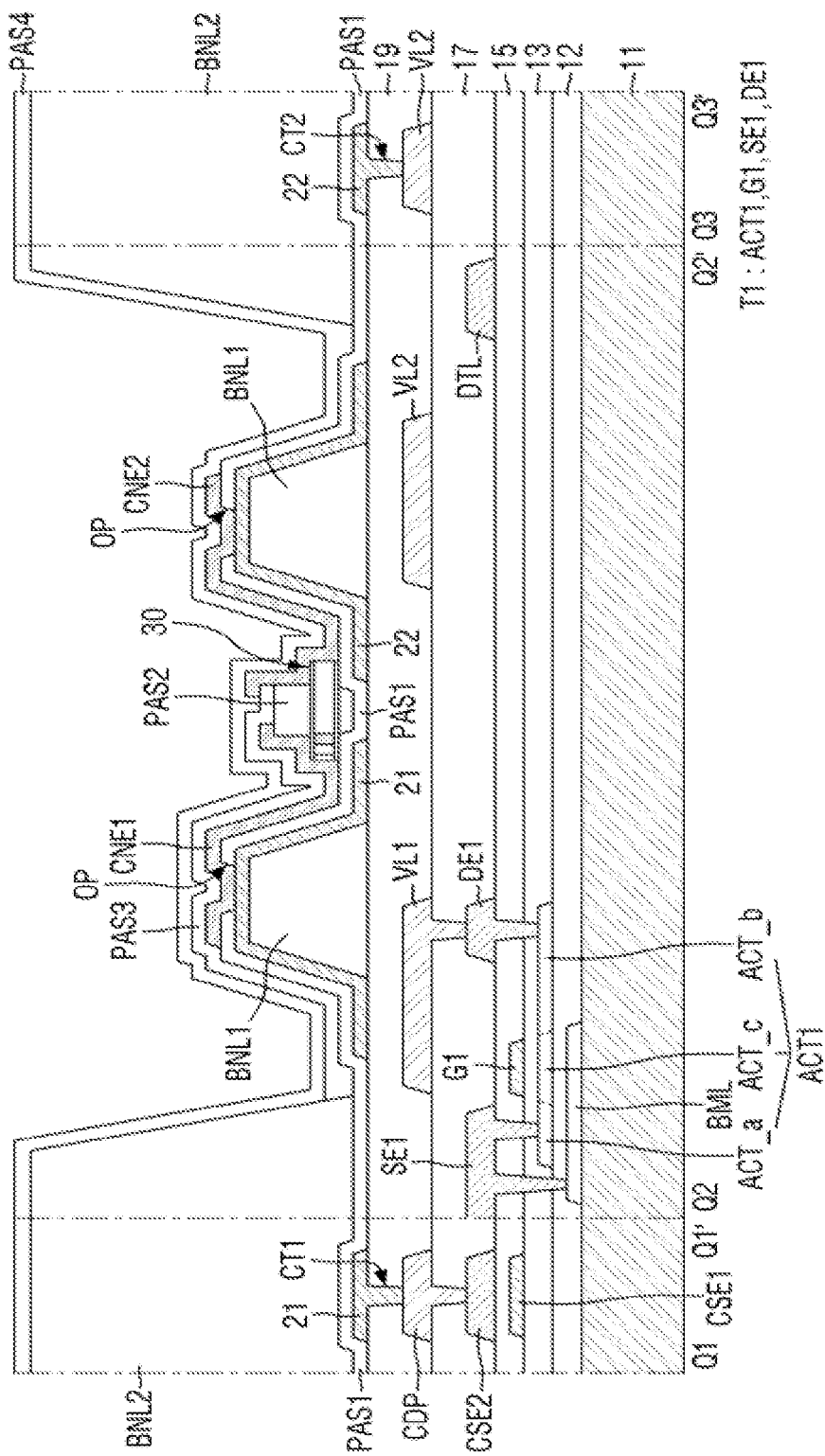
FIG. 3 is a cross-sectional view taken along lines Q1-Q1', Q2-Q2', and Q3-Q3' of FIG. 2.

FIG. 3 is a cross-sectional view taken along lines Q1-Q1', Q2-Q2', and Q3-Q3' of FIG. 2. FIG. 3 illustrates a cross section across both ends of a light emitting element 30 in the first subpixel PX1 of FIG. 2.

Referring to FIG. 3 in connection with FIG. 2, the display device 10 may include a substrate 11 and a semiconductor layer, a plurality of conductive layers, and a plurality of insulating layers on the substrate 11. The semiconductor layer, the conductive layers, and the insulating layers may constitute a circuit layer and a light emitting element layer of the display device 10.

For example, the substrate 11 may be an insulating substrate (e.g., an electrically insulating substrate). The substrate 11 may be made of an insulating material such as glass, quartz, and/or polymer resin. In addition, the substrate 11 may be a rigid substrate, but may also be a flexible substrate that can be bent, folded, and/or rolled.

A light blocking layer BML may be on the substrate 11. The light blocking layer BML is overlapped by an active layer ACT1 of a first transistor T1 of the display device 10. The light blocking layer BML may include a light blocking material to prevent or reduce penetration of light to the active layer ACT1 of the first transistor T1. For example, the light blocking layer BML may be made of an opaque metal material that blocks or reduces transmission of light. However, the disclosure is not limited thereto. In some cases, the light blocking layer BML may be omitted.

A buffer layer 12 may be entirely on the substrate 11 having the light blocking layer BML. The buffer layer 12 may be formed on the substrate 11 to protect the first transistors T1 of the pixel PX from moisture introduced through the substrate 11 which is vulnerable to moisture penetration. The buffer layer 12 may also perform a surface planarization function. The buffer layer 12 may be composed of a plurality of inorganic layers stacked alternately. For example, the buffer layer 12 may be a multilayer in which inorganic layers including at least any one selected from silicon oxide (SiOx), silicon nitride (SiNx), and silicon oxynitride (SiOxNy) are alternately stacked.

The semiconductor layer is on the buffer layer 12. The semiconductor layer may include the active layer ACT1 of the first transistor T1. The active layer ACT1 may be partially overlapped by a gate electrode G1 of a first gate conductive layer which will be further described herein below.

Although only the first transistor T1 among transistors included in each subpixel PXn of the display device 10 is illustrated in the drawings, the disclosure is not limited thereto. The display device 10 may also include additional transistors. For example, the display device 10 may include two, three, or more transistors in each subpixel PXn by including one or more transistors in addition to the first transistor T1.

The semiconductor layer may include polycrystalline silicon, monocrystalline silicon, an oxide semiconductor, and/or the like. When the semiconductor layer includes an oxide semiconductor, each active layer ACT1 may include a plurality of conductive regions ACT_a and ACT_b and a channel region ACT_c between them. The oxide semiconductor may include an oxide semiconductor containing indium (In). For example, the oxide semiconductor may include indium tin oxide (ITO), indium zinc oxide (IZO), indium gallium oxide (IGO), indium zinc tin oxide (IZTO), indium gallium tin oxide (IGTO), and/or indium gallium zinc tin oxide (IGZTO).

In an embodiment, the semiconductor layer may include polycrystalline silicon. The polycrystalline silicon may be formed by crystallizing amorphous silicon. In this case, each of the conductive regions ACT_a and ACT_b of the active layer ACT1 may be a doping region doped with impurities.

A first gate insulating layer 13 is on the semiconductor layer and the buffer layer 12. The first gate insulating layer 13 may be on the buffer layer 12 having the semiconductor layer. The first gate insulating layer 13 may function as a gate insulating layer of each transistor. The first gate insulating layer 13 may be an inorganic layer including an inorganic material such as silicon oxide (SiOx), silicon nitride (SiNx), and/or silicon oxynitride (SiOxNy) or may have a structure in which the above materials are stacked.

The first gate conductive layer is on the first gate insulating layer 13. The first gate conductive layer may include the gate electrode G1 of the first transistor T1 and a first capacitive electrode CSE1 of a storage capacitor. The gate electrode G1 may overlap the channel region ACTc of the active layer ACT1 in a thickness direction. The first capacitive electrode CSE1 may be overlapped by a second capacitive electrode CSE2, which will be further described herein below, in the thickness direction. In an embodiment, the first capacitive electrode CSE1 may be integrally coupled to the gate electrode G1. The first capacitive electrode CSE1 may be overlapped by the second capacitive electrode CSE2 in the thickness direction, and the storage capacitor may be formed between the first capacitive electrode CSE1 and the second capacitive electrode CSE2.

The first gate conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

A first interlayer insulating layer 15 is on the first gate conductive layer. The first interlayer insulating layer 15 may function as an insulating layer (e.g., an electrically insulating layer) between the first gate conductive layer and other layers on the first gate conductive layer. In addition, the first interlayer insulating layer 15 may cover and protect the first gate conductive layer. The first interlayer insulating layer 15 may be an inorganic layer including an inorganic material such as silicon oxide (SiOx), silicon nitride (SiNx), and/or silicon oxynitride (SiOxNy) or may have a structure in which the above materials are stacked.

A first data conductive layer is on the first interlayer insulating layer 15. The first data conductive layer may include a first source electrode SE1 and a first drain electrode DE1 of the first transistor T1, a data line DTL, and the second capacitive electrode CSE2.

The first source electrode SE1 and the first drain electrode DE1 of the first transistor T1 may respectively contact the conductive regions ACTa and ACTb of the active layer ACT1 through contact holes that penetrate the first interlayer insulating layer 15 and the first gate insulating layer 13. In addition, the first source electrode SE1 of the first transistor T1 may be electrically coupled to the light blocking layer BML through another contact hole.

In some embodiments, the data line DTL may transmit a data signal to other transistors included in the display device 10. For example, the data line DTL may be coupled to source/drain electrodes of other transistors to transmit a received signal to the source/drain electrodes.

The second capacitive electrode CSE2 overlaps the first capacitive electrode CSE1 in the thickness direction. In an embodiment, the second capacitive electrode CSE2 may be integrally coupled to the first source electrode SE1.

The first data conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

A second interlayer insulating layer 17 is on the first data conductive layer. The second interlayer insulating layer 17 may function as an insulating layer (e.g., an electrically insulating layer) between the first data conductive layer and other layers on the first data conductive layer. In addition, the second interlayer insulating layer 17 may cover and protect the first data conductive layer. The second interlayer insulating layer 17 may be an inorganic layer including an inorganic material such as silicon oxide (SiOx), silicon nitride (SiNx), and/or silicon oxynitride (SiOxNy) or may have a structure in which the above materials are stacked.

A second data conductive layer is on the second interlayer insulating layer 17. The second data conductive layer may include a first voltage wiring VL1, a second voltage wiring VL2, and a first conductive pattern CDP. A high potential voltage (or a first power supply voltage) to be supplied to the first transistor T1 may be applied to the first voltage wiring VL1, and a low potential voltage (or a second power supply voltage) to be supplied to a second electrode 22 may be applied to the second voltage wiring VL2. In addition, an alignment signal utilized to or needed to align the light emitting elements 30 may be transmitted to the second voltage wiring VL2 during a manufacturing process of the display device 10.

The first conductive pattern CDP may be coupled to the second capacitive electrode CSE2 through a contact hole formed in the second interlayer insulating layer 17. The second capacitive electrode CSE2 may be integrated with the first source electrode SE1 of the first transistor T1, and the first conductive pattern CDP may be electrically coupled to the first source electrode SE1. The first conductive pattern CDP may also contact (e.g., physically contact) a first electrode 21, which is further described herein below, and the first transistor T1 may transmit the first power supply voltage received from the first voltage wiring VL1 to the first electrode 21 through the first conductive pattern CDP. Although the second data conductive layer includes one second voltage wiring VL2 and one first voltage wiring VL1 in the drawings, the disclosure is not limited thereto. The second data conductive layer may also include additional first voltage wirings VL1 and additional second voltage wirings VL2.

The second data conductive layer may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

A first planarization layer 19 is on the second data conductive layer. The first planarization layer 19 may include an organic insulating material, for example, an organic material such as polyimide (PI), and may perform a surface planarization function.

A plurality of first banks BNL1, a plurality of electrodes 21 and 22, the light emitting elements 30, a plurality of contact electrodes CNE1 and CNE2, and the second bank BNL2 are on the first planarization layer 19. In addition, a plurality of insulating layers PAS1 through PAS3 may be on the first planarization layer 19.

The first banks BNL1 may be directly on the first planarization layer 19. The first banks BNL1 may extend in the second direction D2 in each subpixel PXn but may be within the emission area EMA without extending to other subpixels PXn neighboring in the second direction D2. In addition, the first banks BNL1 may be spaced apart from each other in the first direction D1, and the light emitting elements 30 may be between them. The first banks BNL1 may be in each subpixel PXn to form linear patterns in the display area DPA of the display device 10. Although two first banks BNL1 are illustrated in the drawings, the disclosure is not limited thereto. For example, additional first banks BNL1 may also be included depending on the number of the electrodes 21 and 22.

At least a portion of each of the first banks BNL1 may protrude from an upper surface of the first planarization layer 19. The protruding portion of each of the first banks BNL1 may have inclined side surfaces, and light emitted from the light emitting elements 30 may be reflected by the electrodes 21 and 22 on the first banks BNL1 to travel toward above the first planarization layer 19. The first banks BNL1 may provide an area where the light emitting elements 30 are included while functioning as reflective barriers that reflect light emitted from the light emitting elements 30 in an upward direction. The side surfaces of the first banks BNL1 may be inclined in a linear shape (e.g., the side surfaces may be linear surfaces). However, the disclosure is not limited thereto, and the first banks BNL1 may also have semicircular or semi-elliptical outer surfaces. The first banks BNL1 may include an organic insulating material such as polyimide (P1), but the disclosure is not limited thereto.

The electrodes 21 and 22 are on the first banks BNL1 and the first planarization layer 19. The electrodes 21 and 22 may include the first electrode 21 and the second electrode 22. The first electrode 21 and the second electrode 22 may extend in the second direction D2 and may be spaced apart from each other in the first direction D1.

The first electrode 21 and the second electrode 22 may extend in the second direction D2 in each subpixel PXn and may be separated from (e.g., spaced apart from) other electrodes 21 and 22 in the cut area CBA. For example, the cut area CBA may be between the emission areas EMA of subpixels PXn neighboring in the second direction D2, and the first electrode 21 and the second electrode 22 may be separated in the cut area CBA from (e.g., may be spaced apart in the cut area CBA from) another first electrode 21 and another second electrode 22 in a subpixel PXn neighboring in the second direction D2. However, the disclosure is not limited thereto, and some electrodes 21 and 22 may not be separated in each subpixel PXn but may extend beyond subpixels PXn neighboring in the second direction D2 (e.g., any one selected from the first electrode 21 and the second electrode 22 may extend from subpixel PXn to another subpixel PXn), or any one selected from the first electrode 21 and the second electrode 22 may be separated (e.g., may be spaced apart).

The first electrode 21 may be electrically coupled to the first transistor T1 through a first contact hole CT1, and the second electrode 22 may be electrically coupled to the second voltage wiring VL2 through a second contact hole CT2. For example, the first electrode 21 may contact (e.g., physically contact) the first conductive pattern CDP through the first contact hole CT1 that penetrates the first planarization layer 19 in a portion of the second bank BNL2 extending in the first direction D1. The second electrode 22 may also contact (e.g., physically contact) the second voltage wiring VL2 through the second contact hole CT2 that penetrates the first planarization layer 19 in the portion of the second bank BNL2 extending in the first direction D1. However, the disclosure is not limited thereto. In an embodiment, the first contact hole CT1 and the second contact hole CT2 may be in the emission area EMA surrounded by the second bank BNL2 so as not to overlap the second bank BNL2.

Although one first electrode 21 and one second electrode 22 are in each subpixel PXn in the drawings, the disclosure is not limited thereto, and there may be more first electrodes 21 and second electrodes 22 in each subpixel PXn. In addition, the first electrode 21 and the second electrode 22 in each subpixel PXn may not necessarily extend in one direction but may be in various suitable structures. For example, the first electrode 21 and the second electrode 22 may be partially curved or bent, or any one electrode may surround the other electrode.

The first electrode 21 and the second electrode 22 may be directly on the first banks BNL1, respectively. The first electrode 21 and the second electrode 22 may be formed to have greater widths than the first banks BNL1, respectively. For example, the first electrode 21 and the second electrode 22 may cover the outer surfaces of the first banks BNL1, respectively. The first electrode 21 and the second electrode 22 may be on the side surfaces of the first banks BNL1, respectively, and a gap between the first electrode 21 and the second electrode 22 may be smaller than a gap between the first banks BNL1. In addition, at least a portion of each of the first electrode 21 and the second electrode 22 may be directly on the first planarization layer 19, and thus the parts may lie in the same (e.g., substantially the same) plane. However, the disclosure is not limited thereto. In some cases, the widths of the electrodes 21 and 22 may be smaller than those of the first banks BNL1. However, each of the electrodes 21 and 22 may cover at least one side surface of the first bank BNL1 to reflect light emitted from the light emitting elements 30.

Each electrode 21 or 22 may include a conductive material (e.g., an electrically conductive material) having high reflectivity. For example, each electrode 21 or 22 may include a metal such as silver (Ag), copper (Cu), and/or aluminum (Al) as a material having high reflectivity or may be an alloy including aluminum (Al), nickel (Ni), and/or lanthanum (La). Each electrode 21 or 22 may reflect light, which travels toward the side surfaces of the first banks BNL1 after being emitted from the light emitting elements 30, toward above each subpixel PXn.

However, the disclosure is not limited thereto, and each electrode 21 or 22 may further include a transparent conductive material. For example, each electrode 21 or 22 may include a material such as indium tin oxide (ITO), indium zinc oxide (IZO), and/or indium tin zinc oxide (ITZO). In some embodiments, each electrode 21 or 22 may have a structure in which a transparent conductive material and a metal layer having high reflectivity are each stacked in one or more layers or may be formed as a single layer including the transparent conductive material and the metal layer. For example, each electrode 21 or 22 may have a stacked structure of ITO/Ag/ITO, ITO/Ag/IZO, or ITO/Ag/ITZO/IZO.

The electrodes 21 and 22 may be electrically coupled to the light emitting elements 30, and a set or predetermined voltage may be applied to the electrodes 21 and 22 such that the light emitting elements 30 can emit light. The electrodes 21 and 22 may be electrically coupled to the light emitting elements 30 through the contact electrodes CNE1 and CNE2, and electrical signals transmitted to the electrodes 21 and 22 may be transmitted to the light emitting elements 30 through the contact electrodes CNE1 and CNE2.

Any one of the first electrode 21 and the second electrode 22 may be electrically coupled to anodes of the light emitting elements 30, and the other one may be electrically coupled to cathodes of the light emitting elements 30. However, the disclosure is not limited thereto, and the opposite may also be the case.

In addition, the electrodes 21 and 22 may be utilized to form an electric field in each subpixel PXn so as to align the light emitting elements 30. The light emitting elements 30 may be placed between the first electrode 21 and the second electrode 22 by an electric field formed on the first electrode 21 and the second electrode 22 (e.g., an electric formed by the first electrode 21 and the second electrode 22 such that the electric field extends between and around the first electrode 21 and the second electrode 22). The light emitting elements 30 of the display device 10 may be sprayed onto the electrodes 21 and 22 through an inkjet printing process. When ink containing the light emitting elements 30 is sprayed onto the electrodes 21 and 22, alignment signals are transmitted to the electrodes 21 and 22 to generate an electric field. The light emitting elements 30 dispersed in the ink may be aligned on the electrodes 21 and 22 by a dielectrophoretic force due to the electric field generated on (or by) the electrodes 21 and 22.

A first insulating layer PAS1 is on the first planarization layer 19. The first insulating layer PAS1 may cover the first banks BNL1 and the first and second electrodes 21 and 22. The first insulating layer PAS1 may protect the first and second electrodes 21 and 22 while insulating (e.g., electrically insulating) the first and second electrodes 21 and 22 from each other. In addition, the first insulating layer PAS1 may prevent or reduce direct contact of the light emitting elements 30 on the first insulating layer PAS1 with other members, thereby preventing or reducing damage to the light emitting elements 30.

In an embodiment, the first insulating layer PAS1 may include the openings OP partially exposing the first electrode 21 and the second electrode 22. Each opening OP may partially expose a portion of the electrode 21 or 22 which is on an upper surface of the first bank BNL1. A portion of each of the contact electrodes CNE1 and CNE2 may contact (e.g., physically contact) the electrode 21 or 22 exposed through the opening OP.

The first insulating layer PAS1 may be stepped such that a portion of an upper surface of the first insulating layer PAS1 is recessed between the first electrode 21 and the second electrode 22. For example, because the first insulating layer PAS1 covers the first electrode 21 and the second electrode 22, the upper surface of the first insulating layer PAS1 may be stepped according to the shapes of the electrodes 21 and 22 under the first insulating layer PAS1. However, the disclosure is not limited thereto.

The second bank BNL2 may be on the first insulating layer PAS1. The second bank BNL2 may include parts extending in the first direction D1 and the second direction D2 to form a lattice pattern over the entire display area DPA in a plan view. The second bank BNL2 may be at the boundary of each subpixel PXn to separate neighboring subpixels PXn.

In addition, the second bank BNL2 may surround the emission area EMA and the cut area CBA in each subpixel PXn to separate (e.g., physically separate) the subpixels PXn from each other. The first electrode 21 and the second electrode 22 may extend in the second direction D2 to cross a portion of the second bank BNL2 extending in the first direction D1. Of a portion of the second bank BNL2 extending in the second direction D2, a segment between the emission areas EMA may have a greater width than a segment between the cut areas CBA. Accordingly, the gap between the cut areas CBA may be smaller than the gap between the emission areas EMA.

The second bank BNL2 may be formed to have a greater height than the first banks BNL1. The second bank BNL2 may prevent or reduce overflow of ink to adjacent subpixels PXn in an inkjet printing process of the manufacturing process of the display device 10. Therefore, the second bank BNL2 may separate inks in which different light emitting elements 30 are dispersed for different subpixels PXn, so that the inks are not mixed with each other. Like the first banks BNL1, the second bank BNL2 may include polyimide (PI), but the disclosure is not limited thereto.

The light emitting elements 30 may be on the first insulating layer PAS1. The light emitting elements 30 may be spaced apart from each other along the second direction D2 in which each electrode 21 or 22 extends and may be aligned substantially parallel to each other. The light emitting elements 30 may extend in a direction, and the direction in which each electrode 21 or 22 extends and the direction in which the light emitting elements 30 extend may be substantially perpendicular to each other. However, the disclosure is not limited thereto, and the light emitting elements 30 may also extend in a direction not perpendicular but oblique to the direction in which each electrode 21 or 22 extends.

The light emitting elements 30 in different subpixels PXn may include light emitting layers 36 (see FIG. 4) including different materials to emit light of different wavelength bands. Accordingly, light of the first color, light of the second color, and light of the third color may be output from the first subpixel PX1, the second subpixel PX2, and the third subpixel PX3, respectively. However, the disclosure is not limited thereto, and the subpixels PXn may also include the light emitting elements 30 of the same type (or kind) to emit light of substantially the same color.

Both ends of each light emitting element 30 between the first banks BNL1 may be on the electrodes 21 and 22, respectively. A length by which each light emitting element 30 extends may be greater than the gap between the first electrode 21 and the second electrode 22, and both ends of each light emitting element 30 may be on the first electrode 21 and the second electrode 22, respectively. For example, a first end of each light emitting element 30 may be on the first electrode 21, and a second end may be on the second electrode 22.

Each light emitting element 30 may include a plurality of layers in a direction parallel to an upper surface of the substrate 11 or the first planarization layer 19. The direction in which each light emitting element 30 extends may be parallel to the upper surface of the first planarization layer 19, and a plurality of semiconductor layers included in each light emitting element 30 may be sequentially arranged along the direction parallel (e.g., substantially parallel) to the upper surface of the first planarization layer 19. However, the disclosure is not limited thereto. When each light emitting element 30 has a different structure, the semiconductor layers may be in a direction perpendicular (e.g., substantially perpendicular) to the upper surface of the first planarization layer 19.

Both ends of each light emitting element 30 may contact (e.g., physically contact) the contact electrodes CNE1 and CNE2, respectively. For example, an insulating layer 38 (see FIG. 4) may not be formed on end surfaces of each light emitting element 30 in the direction in which each light emitting element 30 extends, thereby partially exposing the semiconductor layers. The exposed semiconductor layers may contact (e.g., physically contact) the contact electrodes CNE1 and CNE2. However, the disclosure is not limited thereto, and at least a portion of the insulating layer 38 of each light emitting element 30 may also be removed to partially expose side surfaces of both ends of the semiconductor layers. The exposed side surfaces of the semiconductor layers may directly contact (e.g., physically contact) the contact electrodes CNE1 and CNE2.

A second insulating layer PAS2 may be partially on the light emitting elements 30. For example, the second insulating layer PAS2 on each light emitting element 30 may have a width smaller than the length of the light emitting element 30 to cover the light emitting element 30 while exposing both ends of the light emitting element 30. The second insulating layer PAS2 may cover the light emitting elements 30, the electrodes 21 and 22 and the first insulating layer PAS1 and then be removed to expose both ends of each light emitting element 30 during the manufacturing process of the display device 10. The second insulating layer PAS2 may extend in the second direction D2 on the first insulating layer PAS1 in a plan view to form a linear or island pattern in each subpixel PXn. The second insulating layer PAS2 may protect the light emitting elements 30 while fixing the light emitting elements 30 in the manufacturing process of the display device 10.

The contact electrodes CNE1 and CNE2 and a third insulating layer PAS3 may be on the second insulating layer PAS2.

The contact electrodes CNE1 and CNE2 may extend in a direction and may be on the electrodes 21 and 22, respectively. The contact electrodes CNE1 and CNE2 may include a first contact electrode CNE1 on the first electrode 21 and a second contact electrode CNE2 on the second electrode 22. The contact electrodes CNE1 and CNE2 may be spaced apart from each other and may face each other. For example, the first contact electrode CNE1 and the second contact electrode CNE2 may be on the first electrode 21 and the second electrode 22, respectively, and may be spaced apart from each other in the first direction D1. Each contact electrode CNE1 or CNE2 may form a stripe pattern in the emission area EMA of each subpixel PXn.

Each of the contact electrodes CNE1 and CNE2 may contact (e.g., physically contact) the light emitting elements 30. The first contact electrode CNE1 may contact (e.g., physically contact) the first ends of the light emitting elements 30, and the second contact electrode CNE2 may contact (e.g., physically contact) the second ends of the light emitting elements 30. The semiconductor layers may be exposed on both end surfaces of each light emitting element 30 in the direction in which each light emitting element 30 extends, and the contact electrodes CNE1 and CNE2 may directly contact (e.g., physically contact) and thus be electrically coupled to the exposed semiconductor layers of each light emitting element 30, respectively. Respective sides of the contact electrodes CNE1 and CNE2 which contact (e.g., physically contact) both ends of each light emitting element 30 may be on the second insulating layer PAS2. In addition, the first contact electrode CNE1 may contact (e.g., physically contact) the first electrode 21 through the opening OP exposing a portion of an upper surface of the first electrode 21, and the second contact electrode CNE2 may contact (e.g., physically contact) the second electrode 22 through the opening OP exposing a portion of an upper surface of the second electrode 22.

A width of each contact electrode CNE1 or CNE2 measured in a direction may be smaller than a width of each electrode 21 or 22 measured in the direction. The contact electrodes CNE1 and CNE2 may contact (e.g., physically contact) the first end and the second end of each light emitting element 30 while partially covering the upper surfaces of the first electrode 21 and the second electrode 22. However, the disclosure is not limited thereto, and the contact electrodes CNE1 and CNE2 may also be formed to be wider than the electrodes 21 and 22 to cover both sides of the electrodes 21 and 22.

The contact electrodes CNE1 and CNE2 may include a transparent conductive material. For example, the contact electrodes CNE1 and CNE2 may include ITO, IZO, ITZO, and/or aluminum (Al). Light emitted from the light emitting elements 30 may pass through the contact electrodes CNE1 and CNE2 and travel toward the electrodes 21 and 22, but the disclosure is not limited thereto.

Although two contact electrodes CNE1 and CNE2 are in one subpixel PXn in the drawings, the disclosure is not limited thereto. The number of the contact electrodes CNE1 and CNE2 may vary according to the number of the electrodes 21 and 22 in each subpixel PXn.

The third insulating layer PAS3 covers the first contact electrode CNE1. The third insulating layer PAS3 may cover not only the first contact electrode CNE1 but also a side of the second insulating layer PAS2 on which the first contact electrode CNE1 is located. For example, the third insulating layer PAS3 may cover the first contact electrode CNE1 and the first insulating layer PAS1 on the first electrode 21. This arrangement may be achieved by placing an insulating material layer that forms the third insulating layer PAS3 in the entire emission area EMA and then partially removing the insulating material layer to form the second contact electrode CNE2. In the above process, the insulating material layer that forms the third insulating layer PAS3 may be removed together with an insulating material layer that forms the second insulating layer PAS2, and a side of the third insulating layer PAS3 may be aligned with a side of the second insulating layer PAS2. A side of the second contact electrode CNE2 may be on the third insulating layer PAS3 and may be insulated (e.g., electrically insulated) from the first contact electrode CNE1 by the third insulating layer PAS3 interposed between them.

A fourth insulating layer PAS4 may be on the entire display area DPA of the substrate 11. The fourth insulating layer PAS4 may protect members on the substrate 11 from the external environment (e.g., from external moisture and/or air). However, the fourth insulating layer PAS4 can also be omitted.

Each of the first insulating layer PAS1, the second insulating layer PAS2, the third insulating layer PAS3, and the fourth insulating layer PAS4 described above may include an inorganic insulating material and/or an organic insulating material. For example, each of the first insulating layer PAS1, the second insulating layer PAS2, the third insulating layer PAS3, and the fourth insulating layer PAS4 may include an inorganic insulating material such as silicon oxide (SiOx), silicon nitride (SiNx), silicon oxynitride (SiOxNy), aluminum oxide ($Al_2O_3$), and/or aluminum nitride (AlN). In some embodiments, each of the first insulating layer PAS1, the second insulating layer PAS2, the third insulating layer PAS3, and the fourth insulating layer PAS4 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, and/or polymethyl methacrylate-polycarbonate synthetic resin. However, the disclosure is not limited thereto.

Figure 4:
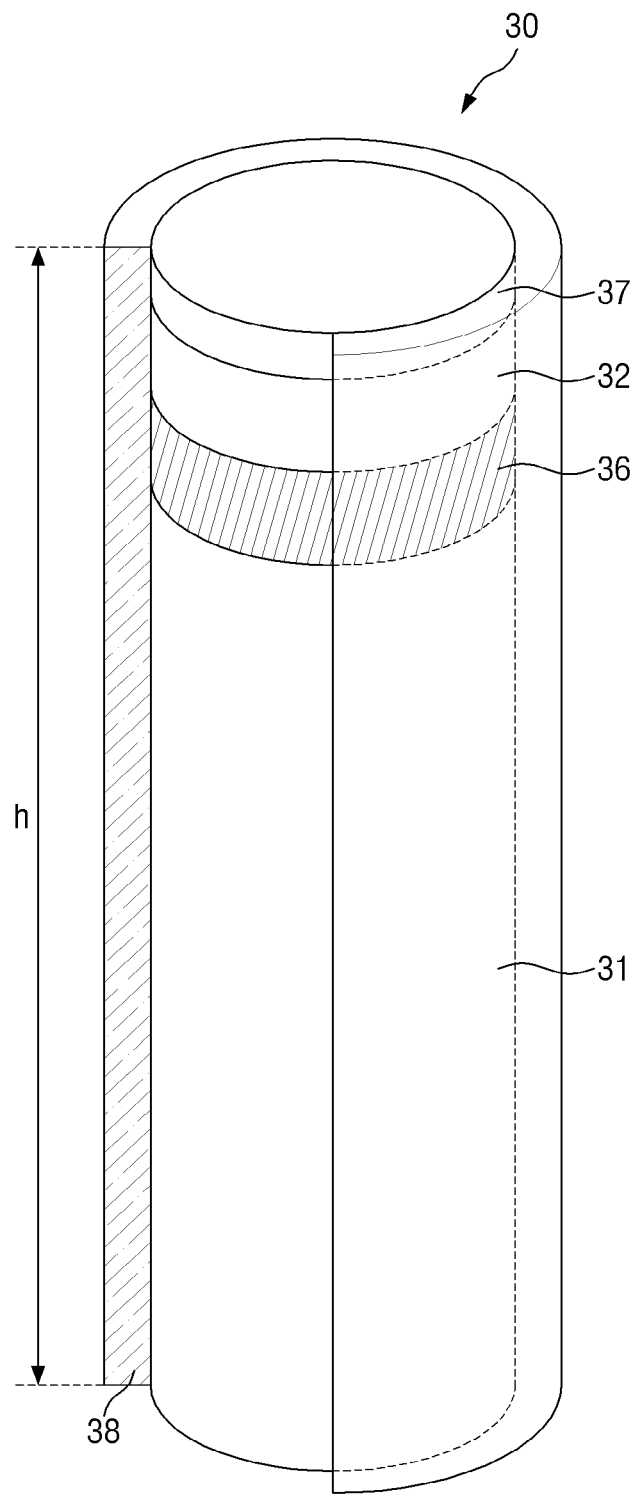
FIG. 4 is a schematic perspective view of a light emitting element according to an embodiment.

FIG. 4 is a schematic perspective view of a light emitting element 30 according to an embodiment.

Referring to FIG. 4, the light emitting element 30 may be a light emitting diode. For example, the light emitting element 30 may be an inorganic light emitting diode having a size in a range of micrometers or nanometers and made of an inorganic material. When an electric field is formed in a set or specific direction between two electrodes 21 and 22 (see FIG. 3) facing each other, the inorganic light emitting diode may be aligned between the two electrodes 21 and 22 (see FIG. 3) in which polarities are formed (e.g., in which opposite polarities are respectively formed). The light emitting element 30 may be aligned between the electrodes 21 and 22 (see FIG. 3) by the electric field formed on the two electrodes 21 and 22.

The light emitting element 30 according to the embodiment may extend in one direction. The light emitting element 30 may be shaped like a cylinder, a rod, a wire, a tube, or the like. However, the shape of the light emitting element 30 is not limited thereto, and the light emitting element 30 may also have various suitable shapes including polygonal prisms, such as a cube, a rectangular parallelepiped and a hexagonal prism, and a shape extending in a direction and having a partially inclined outer surface. A plurality of semiconductors included in the light emitting element 30 may be sequentially arranged or stacked along the one direction.

The light emitting element 30 may include a semiconductor layer doped with impurities of any conductivity type (e.g., a p-type or an n-type). The semiconductor layer may receive an electrical signal from an external power source and emit light of a set or specific wavelength band.

As illustrated in FIG. 4, the light emitting element 30 may include a first semiconductor layer 31, a second semiconductor layer 32, the light emitting layer 36, an electrode layer 37, and the insulating layer 38.

The first semiconductor layer 31 may be an n-type semiconductor. When the light emitting element 30 emits light in a blue wavelength band, the first semiconductor layer 31 may include a semiconductor material having a composition ratio of $Al_xGa_yIn_{(1-x-y)}N$ ($0 \leq x \leq 1$, $0 \leq y \leq 1$, $0 \leq x+y \leq 1$). For example, the semiconductor material included in the first semiconductor layer 31 may be any one or more selected from n-type doped AlGaInN, GaN, AlGaN, InGaN, AlN, and InN. The first semiconductor layer 31 may be doped with an n-type dopant, and the n-type dopant may be Si, Ge, Sn, and/or the like. For example, the first semiconductor layer 31 may be n-GaN doped with n-type Si. A length of the first semiconductor layer 31 may be in a range of, but is not limited to, 1.5 to 5 µm.

The second semiconductor layer 32 is on the light emitting layer 36, which is further described herein below. The second semiconductor layer 32 may be a p-type semiconductor. When the light emitting element 30 emits light in a blue or green wavelength band, the second semiconductor layer 32 may include a semiconductor material having a composition ratio of $Al_xGa_yIn_{(1-x-y)}N$ ($0 \leq x \leq 1$, $0 \leq y \leq 1$, $0 \leq x+y \leq 1$). For example, the semiconductor material included in the second semiconductor layer 32 may be any one or more selected from p-type doped AlGaInN, GaN, AlGaN, InGaN, AlN, and InN. The second semiconductor layer 32 may be doped with a p-type dopant, and the p-type dopant may be Mg, Zn, Ca, Se, Ba, and/or the like. For example, the second semiconductor layer 32 may be p-GaN doped with p-type Mg. A length of the second semiconductor layer 32 may be in a range of, but is not limited to, 0.05 to 0.10 µm.

Although each of the first semiconductor layer 31 and the second semiconductor layer 32 is composed of one layer in the drawing, the disclosure is not limited thereto. Each of the first semiconductor layer 31 and the second semiconductor layer 32 may also include additional layers. For example, each of the first semiconductor layer 31 and the second semiconductor layer 32 may further include a clad layer or a tensile strain barrier reducing (TSBR) layer depending on the material of the light emitting layer 36.

The light emitting layer 36 is between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to electrical signals received through the first semiconductor layer 31 and the second semiconductor layer 32. When the light emitting layer 36 emits light in the blue wavelength band, it may include a material such as AlGaN and/or AlGaInN. In some embodiments, when the light emitting layer 36 has a multiple quantum well structure in which a quantum layer and a well layer are alternately stacked, the quantum layer may include a material such as AlGaN and/or AlGaInN, and the well layer may include a material such as GaN and/or AlInN. For example, the light emitting layer 36 may include AlGaInN as a quantum layer and AlInN as a well layer to emit blue light whose central wavelength band is in a range of 450 to 495 nm.

However, the disclosure is not limited thereto, and the light emitting layer 36 may also have a structure in which a semiconductor material having a large band gap energy and a semiconductor material having a small band gap energy are alternately stacked or may include different group 3 to 5 semiconductor materials depending on the wavelength band of light that it emits. Light emitted from the light emitting layer 36 is not limited to light in the blue wavelength band. In some cases, the light emitting layer 36 may emit light in a red or green wavelength band. A length of the light emitting layer 36 may be in a range of, but is not limited to, 0.05 to 0.10 µm.

Light emitted from the light emitting layer 36 may be radiated not only through a longitudinal outer surface of the light emitting element 30, but also through both side surfaces. The direction of light emitted from the light emitting layer 36 is not limited to one direction.

Figure 5:
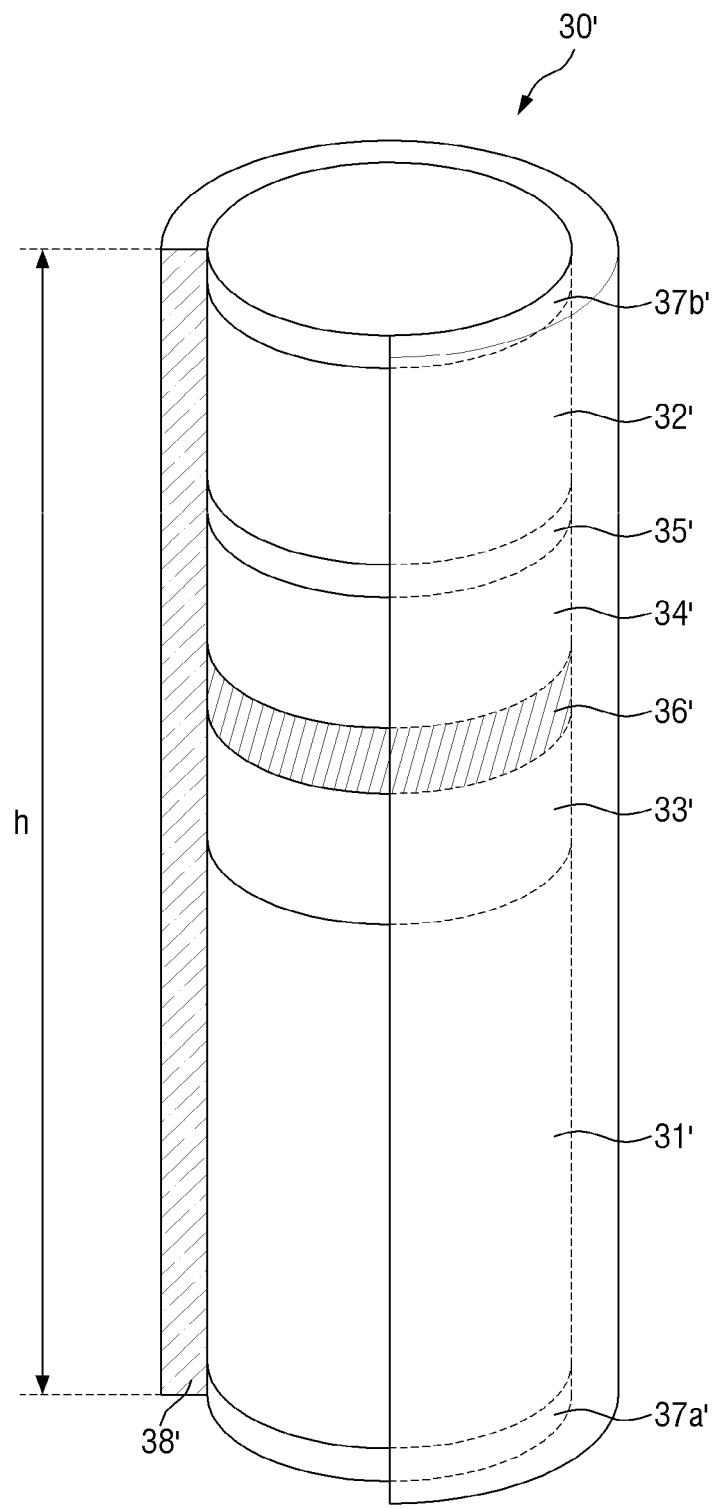
FIG. 5 is a schematic view of a light emitting element according to an embodiment.

FIG. 5 is a schematic view of a light emitting element 30' according to an embodiment.

Referring to FIG. 5, the light emitting element 30' according to the embodiment may further include a third semiconductor layer 33' between a first semiconductor layer 31' and a light emitting layer 36' and a fourth semiconductor layer 34' and a fifth semiconductor layer 35' between the light emitting layer 36' and a second semiconductor layer 32'. The light emitting element 30' of FIG. 5 is different from the embodiment of FIG. 4 in that a plurality of semiconductor layers 33' through 35' and a plurality of electrode layers 37a' and 37b' are further included, and the light emitting layer 36' contains a different element. Hereinafter, any redundant description will not be repeated, and differences will be mainly described.

In the light emitting element 30 of FIG. 4, the light emitting layer 36 may include nitrogen (N) to emit blue or green light. On the other hand, the light emitting element 30' of FIG. 5 may be a semiconductor in which each of the light emitting layer 36' and other semiconductor layers includes at least phosphorous (P). The light emitting element 30' according to the embodiment may emit red light whose central wavelength band is in a range of 620 to 750 nm. However, the central wavelength band of red light is not limited to the above range and may be understood to include all wavelength ranges that can be perceived as red in the art to which the disclosure pertains.

In some embodiments, the first semiconductor layer 31' may be an n-type semiconductor layer and may include a semiconductor material having a composition ratio of $In_xAl_yGa_{(1-x-y)}P$ ($0 \leq x \leq 1$, $0 \leq y \leq 1$, $0 \leq x+y \leq 1$). The first semiconductor layer 31' may be any one or more selected from n-type doped InAlGaP, GaP, AlGaP, InGaP, AlP, and InP. For example, the first semiconductor layer 31' may be n-AlGaInP doped with n-type Si.

The second semiconductor layer 32' may be a p-type semiconductor layer and may include a semiconductor material having a composition ratio of $In_xAl_yGa_{(1-x-y)}P$ ($0 \leq x \leq 1$, $0 \leq y \leq 1$, $0 \leq x+y \leq 1$). The second semiconductor layer 32' may be any one or more selected from p-type doped InAlGaP, GaP, AlGaNP, InGaP, AlP, and InP. For example, the second semiconductor layer 32' may be p-GaP doped with p-type Mg.

The light emitting layer 36' may be between the first semiconductor layer 31' and the second semiconductor layer 32'. The light emitting layer 36' may emit light of a set or specific wavelength band by including a material having a single or multiple quantum well structure. When the light emitting layer 36' has a multiple quantum well structure in which a quantum layer and a well layer are alternately stacked, the quantum layer may include a material such as AlGaP and/or AlInGaP, and the well layer may include a material such as GaP and/or AlInP. For example, the light emitting layer 36' may include AlGaInP as a quantum layer and AlInP as a well layer to emit blue light whose central wavelength band is in a range of 620 to 750 nm.

The light emitting element 30' of FIG. 5 may include a clad layer adjacent to the light emitting layer 36'. As illustrated in the drawing, the third semiconductor layer 33' and the fourth semiconductor layer 34' under and on the light emitting layer 36' and between the first semiconductor layer 31' and the second semiconductor layer 32' may be clad layers.

The third semiconductor layer 33' may be between the first semiconductor layer 31' and the light emitting layer 36'. The third semiconductor layer 33' may be an n-type semiconductor like the first semiconductor layer 31' and may include a semiconductor material having a composition ratio of $In_xAl_yGa_{(1-x-y)}P$ ($0 \leq x \leq 1$, $0 \leq y \leq 1$, $0 \leq x+y \leq 1$). For example, the first semiconductor layer 31' may be n-AlGaInP, and the third semiconductor layer 33' may be n-AlInP. However, the disclosure is not limited thereto.

The fourth semiconductor layer 34' may be between the light emitting layer 36' and the second semiconductor layer 32'. The fourth semiconductor layer 34' may be an n-type semiconductor like the second semiconductor layer 32' and may include a semiconductor material having a composition ratio of $In_xAl_yGa_{(1-x-y)}P$ ($0 \leq x \leq 1$, $0 \leq y \leq 1$, $0 \leq x+y \leq 1$). For example, the second semiconductor layer 32' may be p-GaP, and the fourth semiconductor layer 34' may be p-AlInP.

The fifth semiconductor layer 35' may be between the fourth semiconductor layer 34' and the second semiconductor layer 32'. The fifth semiconductor layer 35' may be a p-type doped semiconductor, like the second semiconductor layer 32' and the fourth semiconductor layer 34'. In some embodiments, the fifth semiconductor layer 35' may reduce a difference in lattice constant between the fourth semiconductor layer 34' and the second semiconductor layer 32'. The fifth semiconductor layer 35' may be a TSBR layer. For example, the fifth semiconductor layer 35' may include, but is not limited to, p-GaInP, p-AlInP, and/or p-AlGaInP. In addition, lengths of the third semiconductor layer 33', the fourth semiconductor layer 34' and the fifth semiconductor layer 35' may be, but are not limited to, in a range of 0.08 to 0.25 μm.

A first electrode layer 37a' and a second electrode layer 37b' may be on the first semiconductor layer 31' and the second semiconductor layer 32', respectively. The first electrode layer 37a' may be on a lower surface of the first semiconductor layer 31', and the second electrode layer 37b' may be on an upper surface of the second semiconductor layer 32'. However, the disclosure is not limited thereto, and at least any one of the first electrode layer 37a' and the second electrode layer 37b' may be omitted. For example, the light emitting element 30' may not be on the lower surface of the first semiconductor layer 31', and only one second electrode layer 37b' may be on the upper surface of the second semiconductor layer 32'.

Referring again to FIG. 4, the electrode layer 37 may be an ohmic contact electrode. However, the disclosure is not limited thereto, and the electrode layer 37 may also be a Schottky contact electrode (e.g., an electrode having a junction formed by a semiconductor and a metal). The light emitting element 30 may include at least one electrode layer 37. Although the light emitting element 30 includes one electrode layer 37 in FIG. 4, the disclosure is not limited thereto. In some cases, the light emitting element 30 may include additional electrode layers 37, or the electrode layer 37 may be omitted. The following description of the light emitting element 30 may be applied the same even if the light emitting element 30 includes a different number of electrode layers 37 or further includes other structures.

When the light emitting element 30 is electrically coupled to an electrode or a contact electrode in the display device 10 according to the embodiment, the electrode layer 37 may reduce the resistance between the light emitting element 30 and the electrode and/or the contact electrode. The electrode layer 37 may include a conductive metal (e.g., an electrically conductive metal). For example, the electrode layer 37 may include at least any one selected from aluminum (Al), titanium (Ti), indium (In), gold (Au), silver (Ag), indium tin oxide (ITO), indium zinc oxide (IZO), and indium tin zinc oxide (ITZO). In addition, the electrode layer 37 may include an n-type or p-type doped semiconductor material. The electrode layer 37 may include the same material or different materials, but the disclosure is not limited thereto.

The insulating layer 38 surrounds outer surfaces of a plurality of semiconductor layers and a plurality of electrode layers described above. For example, the insulating layer 38 may surround the outer surface of at least the light emitting layer 36 and extend in the direction in which the light emitting element 30 extends. The insulating layer 38 may protect the above members. For example, the insulating layer 38 may surround side surfaces of the above members but may expose both ends of the light emitting element 30 in a longitudinal direction.

In the drawing, the insulating layer 38 extends in the longitudinal direction of the light emitting element 30 to cover from side surfaces of the first semiconductor layer 31 to side surfaces of the electrode layer 37. However, the disclosure is not limited thereto, and the insulating layer 38 may also cover outer surfaces of only some semiconductor layers as well as the light emitting layer 36 or may cover only a portion of an outer surface of the electrode layer 37 to partially expose the outer surface of the electrode layer 37. In addition, an upper surface of the insulating layer 38 may be rounded in cross section in an area adjacent to at least one end of the light emitting element 30.

A thickness of the insulating layer 38 may be in a range of, but is not limited to, 10 nm to 1.0 μm. The thickness of the insulating layer 38 may be, for example, about 40 nm.

The insulating layer 38 may include a material having insulating properties (e.g., electrically insulating properties), such as silicon oxide (SiOx), silicon nitride (SiNx), silicon oxynitride (SiOxNy), aluminum nitride (AlN), and/or aluminum oxide ($Al_2O_3$). Accordingly, it can prevent or reduce a likelihood or degree of an electrical short circuit that may occur when the light emitting layer 36 directly contacts an electrode that transmits an electrical signal to the light emitting element 30. In addition, because the insulating layer 38 protects the outer surface of the light emitting element 30 including the light emitting layer 36, a reduction in luminous efficiency can be prevented or reduced.

In addition, an outer surface of the insulating layer 38 may be treated. The light emitting elements 30 dispersed in a set or predetermined ink may be sprayed onto electrodes and then aligned. Here, the surface of the insulating layer 38 may be hydrophobic or hydrophilic-treated (e.g., treated to render the surface of the insulating layer 38 hydrophobic or hydrophilic) so that the light emitting elements 30 are kept separate from each other in the ink without being agglomerated with other adjacent light emitting elements 30. For example, the outer surface of the insulating layer 38 may be treated with a material such as stearic acid and/or 2,3-naphthalene dicarboxylic acid.

A length h of the light emitting element 30 may be in a range of 1 to 10 μm or 2 to 6 μm and may be, for example, in a range of 3 to 5 μm. In addition, a diameter of the light emitting element 30 may be in a range of 30 to 700, and an aspect ratio of the light emitting element 30 may be 1.2 to 100. However, the disclosure is not limited thereto, and a plurality of light emitting elements 30 included in the display device 10 may also have different diameters according to a difference in the composition of the light emitting layer 36. The diameter of the light emitting element 30 may be, for example, about 500 nm.

The shape and material of the light emitting elements 30 are not limited to those of FIGS. 4 and 5. In some embodiments, the light emitting elements 30 may include additional layers or may have a different shape.

An apparatus for inspecting light emitting elements for defects to manufacture the display device 10 according to the above-described embodiment will now be further described.

Figure 6:
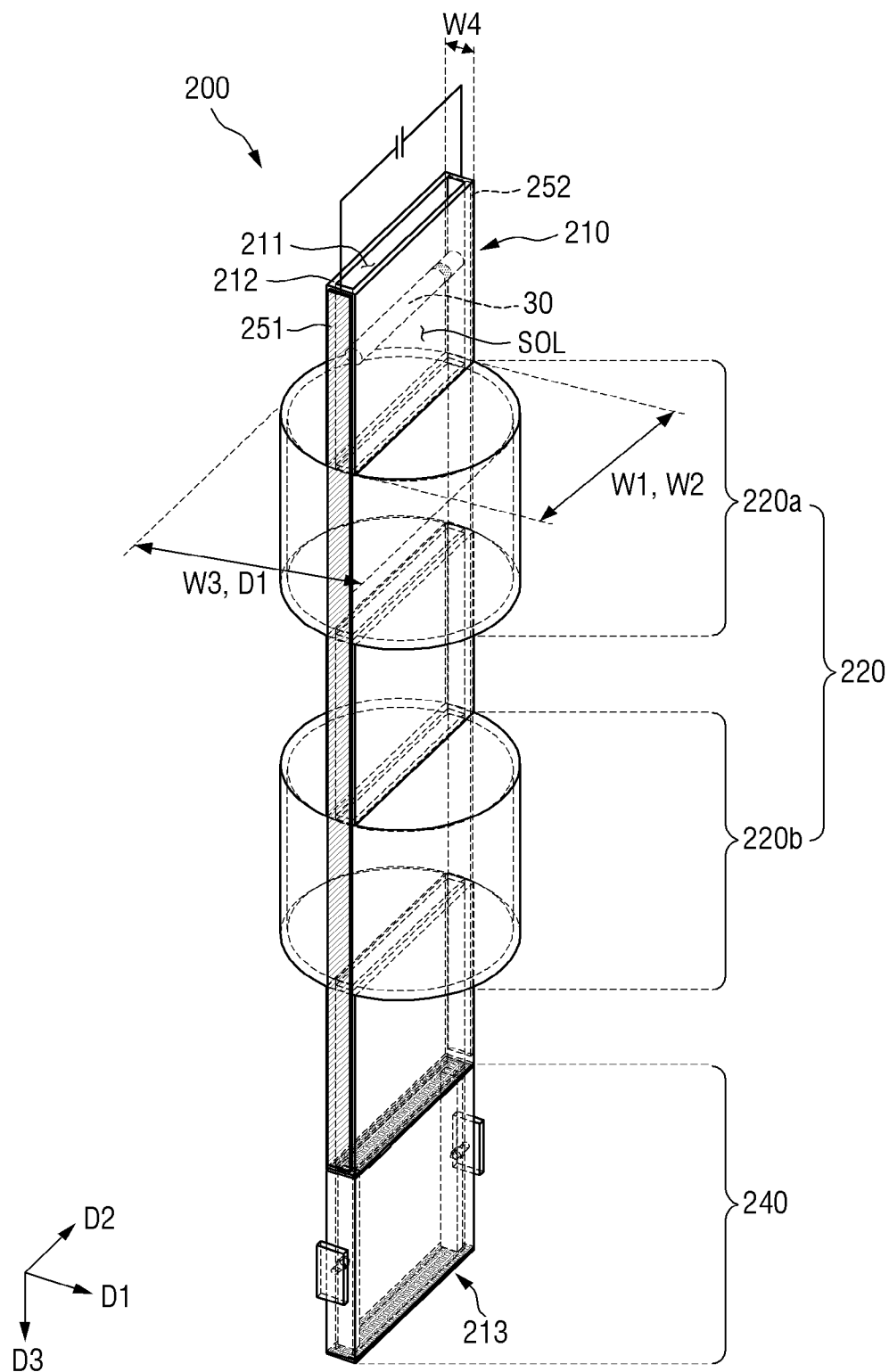
FIG. 6 is a schematic perspective view of an apparatus for inspecting light emitting elements according to an embodiment.
Figure 7:
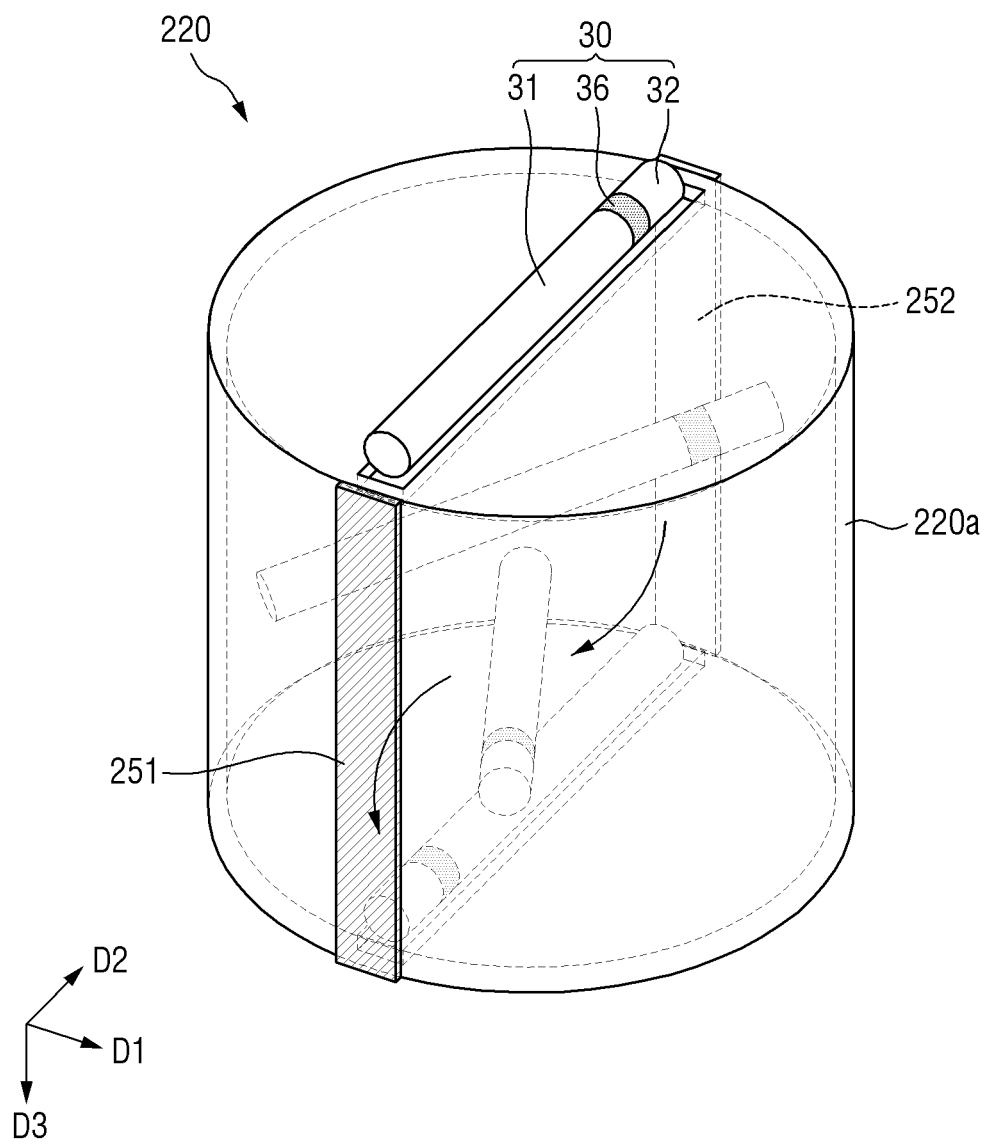
FIG. 7 is a schematic perspective view of an alignment unit of the apparatus for inspecting light emitting elements according to the embodiment.
Figure 8:
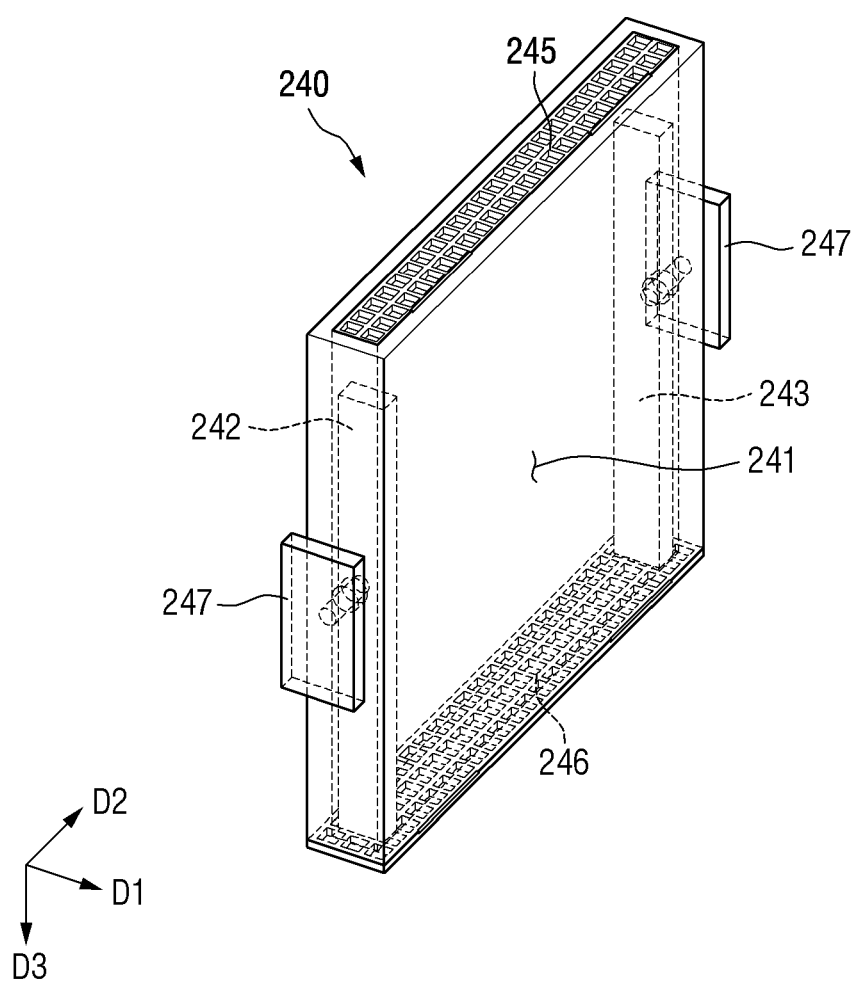
FIG. 8 is a schematic perspective view of a packaging unit of the apparatus for inspecting light emitting elements according to the embodiment.
Figure 9:
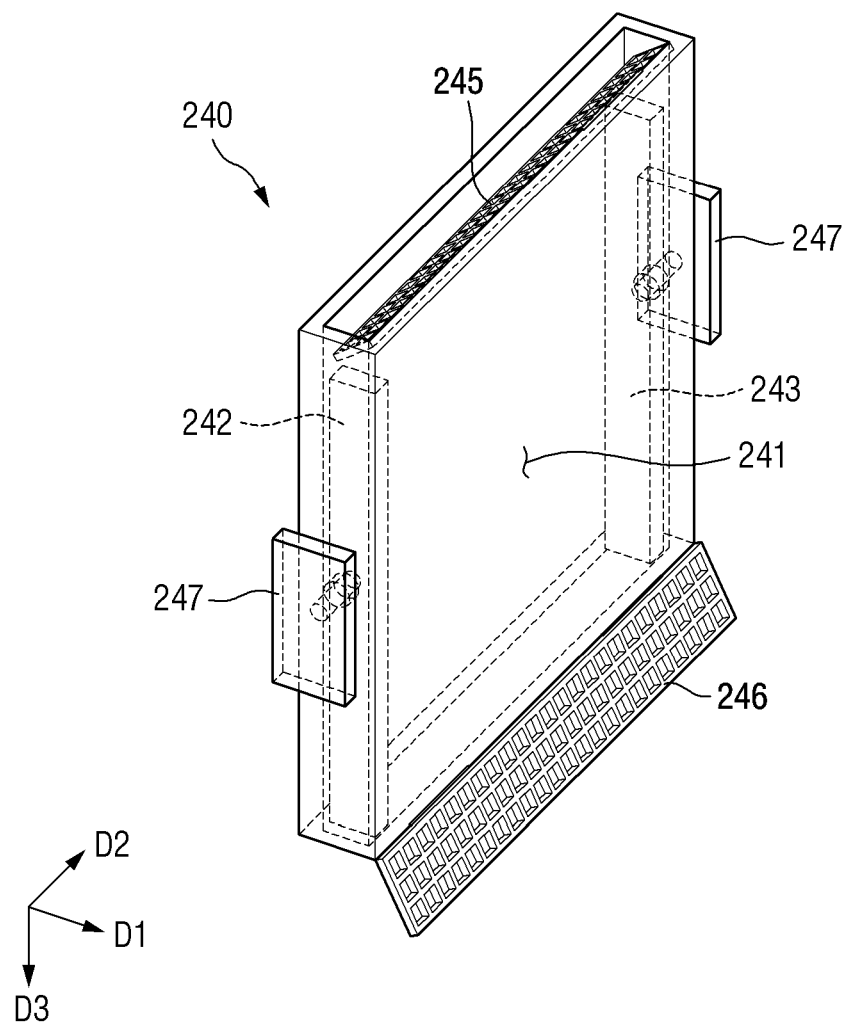
FIG. 9 is a schematic perspective view illustrating opening and closing operations of filtering shutters of the packaging unit according to the embodiment.
Figure 10:
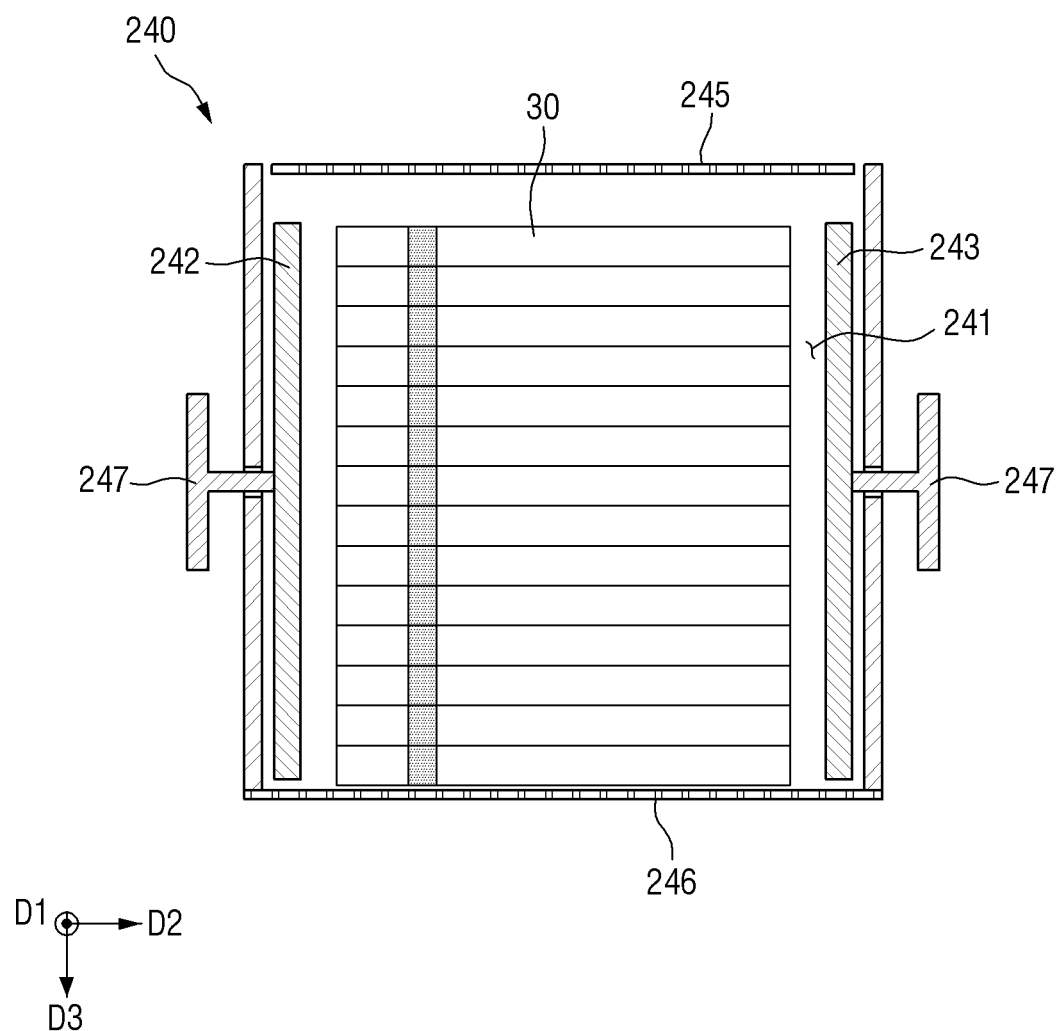
FIGS. 10 and 11 are schematic perspective views illustrating the operation of inspection electrodes of the packaging unit according to the embodiment.
Figure 11:
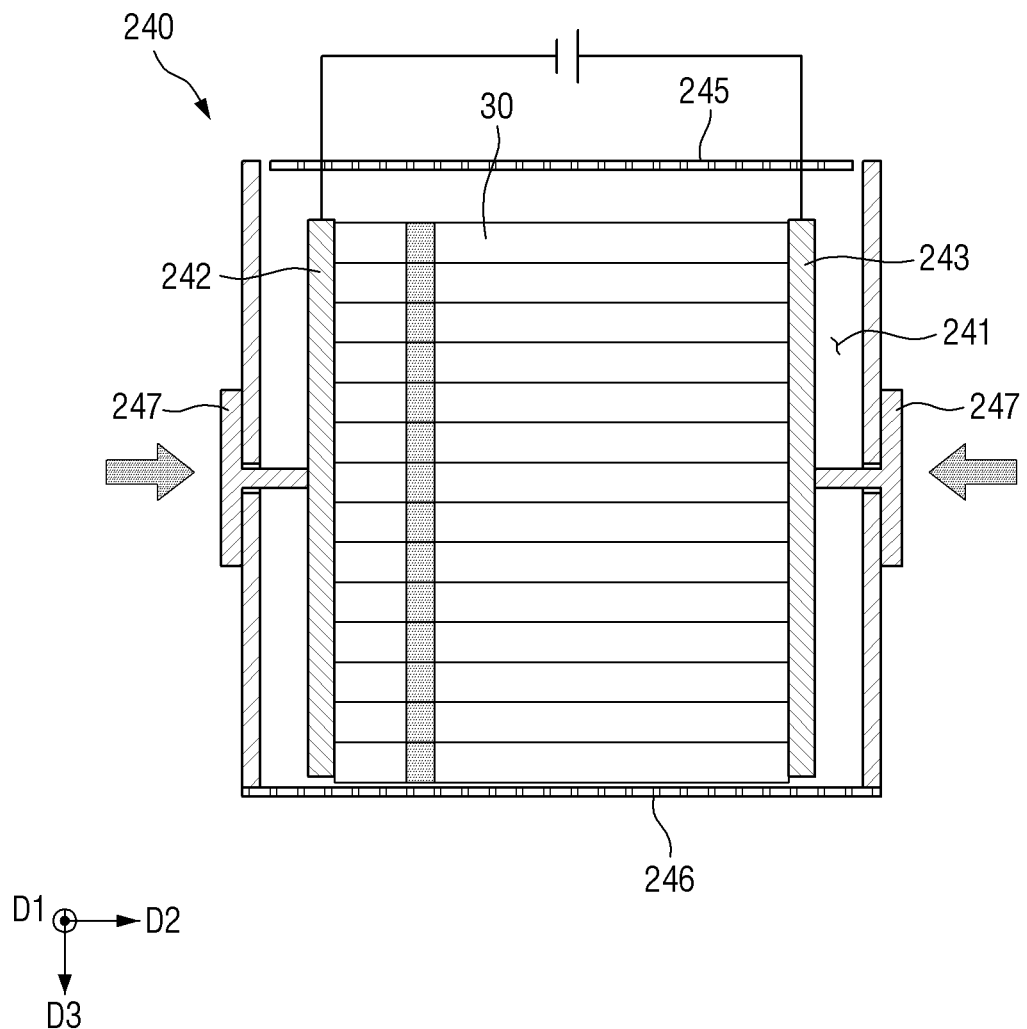

FIG. 6 is a schematic perspective view of an apparatus 200 for inspecting light emitting elements according to an embodiment. FIG. 7 is a schematic perspective view of an alignment unit 220 of the apparatus 200 for inspecting light emitting elements according to the embodiment. FIG. 8 is a schematic perspective view of a packaging unit 240 of the apparatus 200 for inspecting light emitting elements according to the embodiment. FIG. 9 is a schematic perspective view illustrating opening and closing operations of filtering shutters 245 and 246 of the packaging unit 240 according to the embodiment. FIGS. 10 and 11 are schematic perspective views illustrating the operation of inspection electrodes 242 and 243 of the packaging unit 240 according to the embodiment.

In the drawings, a first direction D1, a second direction D2, and a third direction D3 are defined. The first direction D1 and the second direction D2 are located in one plane and orthogonal (e.g., substantially orthogonal) to each other, and the third direction D3 is perpendicular (e.g., substantially perpendicular) to each of the first direction D1 and the second direction D2.

FIG. 6 illustrates the configuration of the apparatus 200 for inspecting light emitting elements according to the embodiment. The structure and arrangement of the apparatus 200 for inspecting light emitting elements are not limited to those of FIG. 6. The apparatus 200 for inspecting light emitting elements may also include additional members and have a different structure from that of FIG. 6.

Referring to FIG. 6, the apparatus 200 for inspecting light emitting elements may include a flow path unit 210, the alignment unit 220 to which a flow path is extended from at least a portion of the flow path unit 210, the packaging unit 240 at an end of the flow path unit 210, and a plurality of alignment electrodes 251 and 252 on an outer surface of the flow path unit 210. The apparatus 200 for inspecting light emitting elements may align and inspect light emitting elements 30 for defects.

The flow path unit 210 may be shaped like a pipe extending in the third direction D3 and may include a flow path 211 along which a solution SOL containing the light emitting elements 30 can move, but the present disclosure is not limited thereto. In an embodiment, a width of the flow path 211 in the first direction D1 may be greater than a length of a short axis of each light emitting element 30 and smaller than a length of a long axis of each light emitting element 30. A width of the flow path 211 in the second direction D2 may be greater than the lengths of the long and short axes of each light emitting element 30. For example, the width of the flow path 211 in each of the first direction D1 and the second direction D2 may be large enough to allow the solution SOL containing the light emitting elements 30 to move. Therefore, the light emitting elements 30 may move along the flow path 211 in a state where longitudinal directions of the light emitting elements 30 are arranged in the second direction D2.

In an embodiment, an upper end of the flow path unit 210 may have a rectangular plane in which two sides extending in the second direction D2 are longer than two sides extending in the first direction D1. In addition, the flow path unit 210 may be shaped like a rectangular parallelepiped extending in the third direction D3.

The flow path unit 210 may be made of an insulating material (e.g., electrically insulating material). To apply an electric field to the flow path unit 210 through the alignment electrodes 251 and 252 which is further described herein below, the flow path unit 210 may be made of an insulating material. The flow path unit 210 may be made of, for example, ceramic and/or polymer.

The flow path unit 210 may include an inlet 212 at the upper end and an outlet 213 at a lower end. The inlet 212 may be an entrance through which the solution SOL is injected into the flow path 211, and the outlet 213 may be an exit through which the solution SOL passing through the flow path 211 is discharged to the outside. Each of the inlet 212 and the outlet 213 may have a rectangular shape so that the longitudinal directions of the light emitting elements 30 mixed in the solution SOL can be arranged in the second direction D2. Likewise, the flow path 211 may have a rectangular planar shape so that the longitudinal directions of the light emitting elements 30 mixed in the solution SOL can be arranged in the second direction D2.

The alignment unit 220 may be an area to which the flow path 211 is extended from at least a portion of the flow path unit 210. The alignment unit 220 may act as a space in which the light emitting elements 30 are rotated and realigned. The alignment unit 220 may include a first alignment area 220a and a second alignment area 220b. The first alignment area 220a and the second alignment area 220b may be spaced apart from each other in the third direction D3.

Each of the first alignment area 220a and the second alignment area 220b may include a semicircular cylindrical shape protruding from the flow path unit 210 in the first direction D1 and a semicircular cylindrical shape protruding from the flow path unit 210 in a direction opposite to the first direction D1. Therefore, each of the first alignment area 220a and the second alignment area 220b may have a circular cylindrical shape as a whole.

A width W1 of each of the first alignment area 220a and the second alignment area 220b in the second direction D2 may be substantially equal to a width W2 of the flow path unit 210 in the second direction D2. On the other hand, a width W3 of each of the first alignment area 220a and the second alignment area 220b in the first direction D1 may be greater than a width W4 of the flow path unit 210 in the first direction D1. The width W3 of each of the first alignment area 220a and the second alignment area 220b in the first direction D1 may be greater than the long axis of each light emitting element 30. In an embodiment, a diameter of each of the first alignment area 220a and the second alignment area 220b in the first direction D1 or the second direction D2 may be greater than the long axis of each light emitting element 30. As is further described herein below, in each of the first alignment area 220a and the second alignment area 220b of the alignment unit 220, the light emitting elements 30 may be rotated by an electric field. Therefore, each of the first alignment area 220a and the second alignment area 220b may provide a space in which the light emitting elements 30 can rotate.

In an embodiment, the first alignment area 220a may serve as an area that primarily aligns the light emitting elements 30, and the second alignment area 220b may serve as an area that secondarily aligns the light emitting elements 30. For example, light emitting elements 30 that fail to be aligned in the first alignment area 220a may be aligned in the second alignment area 220b. In the current embodiment, the alignment unit 220 includes two alignment areas, e.g., the first alignment area 220a and the second alignment area 220b, but the disclosure is not limited thereto, and the alignment unit 220 may also include three or more alignment areas.

The alignment electrodes 251 and 252 may be on both sides of the outer surface of the flow path unit 210, respectively. The alignment electrodes 251 and 252 may include a first alignment electrode 251 and a second alignment electrode 252. The first alignment electrode 251 may be on a side of the outer surface of the flow path unit 210, and the second alignment electrode 252 may be on the other side of the outer surface of the flow path unit 210. The first alignment electrode 251 and the second alignment electrode 252 may be located side by side to face each other. For example, the first alignment electrode 251 may be parallel (e.g., substantially parallel) to the first direction D1 of the flow path unit 210 and may contact (e.g., physically contact) a surface of the flow path unit 210 extending in the third direction D3, and the second alignment electrode 252 may be parallel (e.g., substantially parallel) to the first direction D1 of the flow path unit 210 and may contact (e.g., physically contact) the other surface of the flow path unit 210 extending in the third direction D3.

The alignment unit 220 described above may align the light emitting elements 30. The operation of aligning the light emitting elements 30 in the first alignment area 220a is further described below as a representative example, and the above-described light emitting element 30 illustrated in FIG. 4 is illustrated as an example of the structure of each light emitting element 30.

Referring to FIG. 7, the light emitting elements 30 may be moved to the first alignment area 220a through the flow path unit 210. Because the first alignment area 220a provides a space larger than the long and short axes of the light emitting elements 30, the light emitting elements 30 can easily rotate. The first alignment electrode 251 and the second alignment electrode 252 may be outside both sides of the first alignment area 220a.

The light emitting elements 30 may be moved to the first alignment area 220a in a state where they are mixed in the solution SOL. An electrical signal may be transmitted to each of the first alignment electrode 251 and the second alignment electrode 252.

For example, when an electrical signal, that is, an electric current, is transmitted to the first alignment electrode 251 and the second alignment electrode 252, an electric field may be generated between the first alignment electrode 251 and the second alignment electrode 252. In the current embodiment, a direct current (DC) signal may be transmitted to the first alignment electrode 251 and the second alignment electrode 252. When the DC signal is transmitted to the first alignment electrode 251 and the second alignment electrode 252, the light emitting elements 30 dispersed in the solution SOL may generate a dipole moment in response to the electric field. The light emitting elements 30 having the dipole moment may generate torque TDEP in response to the generated electric field. Accordingly, the light emitting elements 30 may be rotated. In addition, the light emitting elements 30 may be subjected to a dielectrophoretic force FDEP by the electric field. The light emitting elements 30 subjected to the dielectrophoretic force FDEP may move toward a position where the intensity of the electric field is relatively larger. Therefore, both ends of each light emitting element 30 may be rotated toward the first alignment electrode 251 and the second alignment electrode 252, respectively.

Because the apparatus 200 for inspecting light emitting elements according to the embodiment includes a plurality of alignment areas 220a and 220b, the light emitting elements 30 passing through the alignment areas 220a and 220b may all be aligned in one direction. For example, as illustrated in FIG. 7, a light emitting layer 36 of each light emitting element 30 may be adjacent to the first alignment electrode 251. In some embodiments, the light emitting layer 36 of each light emitting element 30 may be adjacent to the second alignment electrode 252.

The packaging unit 240 may extend from the flow path unit 210 and be at an end of the flow path unit 210.

Referring to FIGS. 8 through 11, the packaging unit 240 may include a storage part 241 which temporarily stores the light emitting elements 30, a plurality of inspection electrodes 242 and 243 which are respectively on both sides of the storage part 241, the filtering shutters 245 and 246 which are respectively at upper and lower ends of the storage part 241, and electrode moving parts 247 which move the inspection electrodes 242 and 243.

The storage part 241 may be formed by extending the flow path unit 210.

The storage part 241 may be a space in which the light emitting elements 30 are temporarily stored. The shape of the storage part 241 may be substantially the same as that of the flow path 211 of the flow path unit 210.

The inspection electrodes 242 and 243 may be respectively on both sides inside the storage part 241. The inspection electrodes 242 and 243 may include a first inspection electrode 242 and a second inspection electrode 243. The first inspection electrode 242 may be on one side inside the storage part 241, and the second inspection electrode 243 may be on the other side inside the storage part 241. The first inspection electrode 242 and the second inspection electrode 243 may be located side by side to face each other. For example, the first inspection electrode 242 may be adjacent to a side of the storage part 241 which is parallel (e.g., substantially parallel) to the first direction D1 of the storage part 241, and the second inspection electrode 243 may be adjacent to the other side which is parallel (e.g., substantially parallel) to the first direction D1 of the storage part 241 and faces the above side. The first inspection electrode 242 and the second inspection electrode 243 may be respectively spaced apart from the first alignment electrode 251 and the second alignment electrode 252 described above.

The filtering shutters 245 and 246 may be at the upper and lower ends of the storage part 241, respectively. The filtering shutters 245 and 246 may filter out the light emitting elements 30 from the solution SOL in which the light emitting elements 30 are mixed while letting a solvent flow, so that the light emitting elements 30 are stored in the storage part 241. The filtering shutters 245 and 246 may each include a plurality of openings to allow the solvent to pass therethrough. Each of the openings may be smaller than each of the light emitting elements 30. For example, the filtering shutters 245 and 246 may have a mesh shape that allows the solvent to pass through filtering shutters 245 and 246 and that filters out the light emitting elements 30. However, the shape of each of the filtering shutters 245 and 246 is not limited to the above example, and the filtering shutters 245 and 246 can have any suitable structure as long as they can filter out the light emitting elements 30.

Referring to FIGS. 8 and 9, the filtering shutters 245 and 246 may include a first filtering shutter 245 and a second filtering shutter 246. The first filtering shutter 245 may be on an upper side of the storage part 241, and the second filtering shutter 246 may be on a lower side of the storage part 241. The filtering shutters 245 and 246 may be opened and closed to filter out the light emitting elements 30 when the light emitting elements 30 need to be stored. For example, when the solution SOL in which the light emitting elements 30 are mixed flows to the packaging unit 240 through the flow path unit 210, if the second filtering shutter 246 blocks the lower side of the storage part 241, the light emitting elements 30 are filtered out and stacked on the second filtering shutter 246, and the solution passes through the second filtering shutter 246. In addition, if the first filtering shutter 245 blocks the upper side of the storage part 241 after a set or predetermined time interval, the light emitting elements 30 may be blocked from entering the storage part 241.

In FIGS. 8 and 9, an opening/closing operation in which each filtering shutter 245 or 246 has a side fixed to the storage part 241 and opens downward has been described as an example. However, the disclosure is not limited thereto, and the filtering shutters 245 and 246 may also be inserted from outside the storage part 241.

The electrode moving parts 247 may be outside the storage part 241 and adjacent to the first inspection electrode 242 and the second inspection electrode 243, respectively. The electrode moving parts 247 may horizontally move the first inspection electrode 242 and the second inspection electrode 243. In addition, the electrode moving parts 247 may be electrically coupled to the first inspection electrode 242 and the second inspection electrode 243 to apply currents to them, respectively. The electrode moving parts 247 may horizontally move the inspection electrodes 242 and 243 using, for example, a hydraulic cylinder, but the disclosure is not limited thereto.

Referring to FIGS. 10 and 11, the packaging unit 240 described above may inspect the resistance and luminance of each light emitting element 30 temporarily stored in the storage part 241. For example, when the light emitting elements 30 are aligned in the storage part 241, the first inspection electrode 242 and the second inspection electrode 243 may be horizontally moved by the electrode moving parts 247. The horizontally moved first inspection electrode 242 may contact (e.g., physically contact) a side of each light emitting element 30, and the horizontally moved second inspection electrode 243 may contact (e.g., physically contact) the other side of each light emitting element 30.

The first inspection electrode 242 and the second inspection electrode 243 in contact with both sides of each light emitting element 30 may inspect the resistance and luminance of the light emitting element 30. The light emitting elements 30 may be inspected in units of a plurality of light emitting elements 30 included in the storage part 241 of the packaging unit 240. For example, thirteen light emitting elements 13 in the storage part 241 may form one unit, and the resistance and luminance of one unit of light emitting elements 30 may be measured. With a reference resistance and luminance corresponding to one unit, light emitting elements 30 whose resistances and luminances are equal to or greater than the reference resistance and luminance may be determined to be non-defective and thus may be used in a subsequent process, and light emitting elements 30 whose resistances and luminances are less than the reference resistance and luminance may be determined to be defective and thus may be discarded or reused.

A method of inspecting the light emitting elements 30 for defects by using the above-described apparatus 200 for inspecting light emitting elements will now be described.

Figure 12:
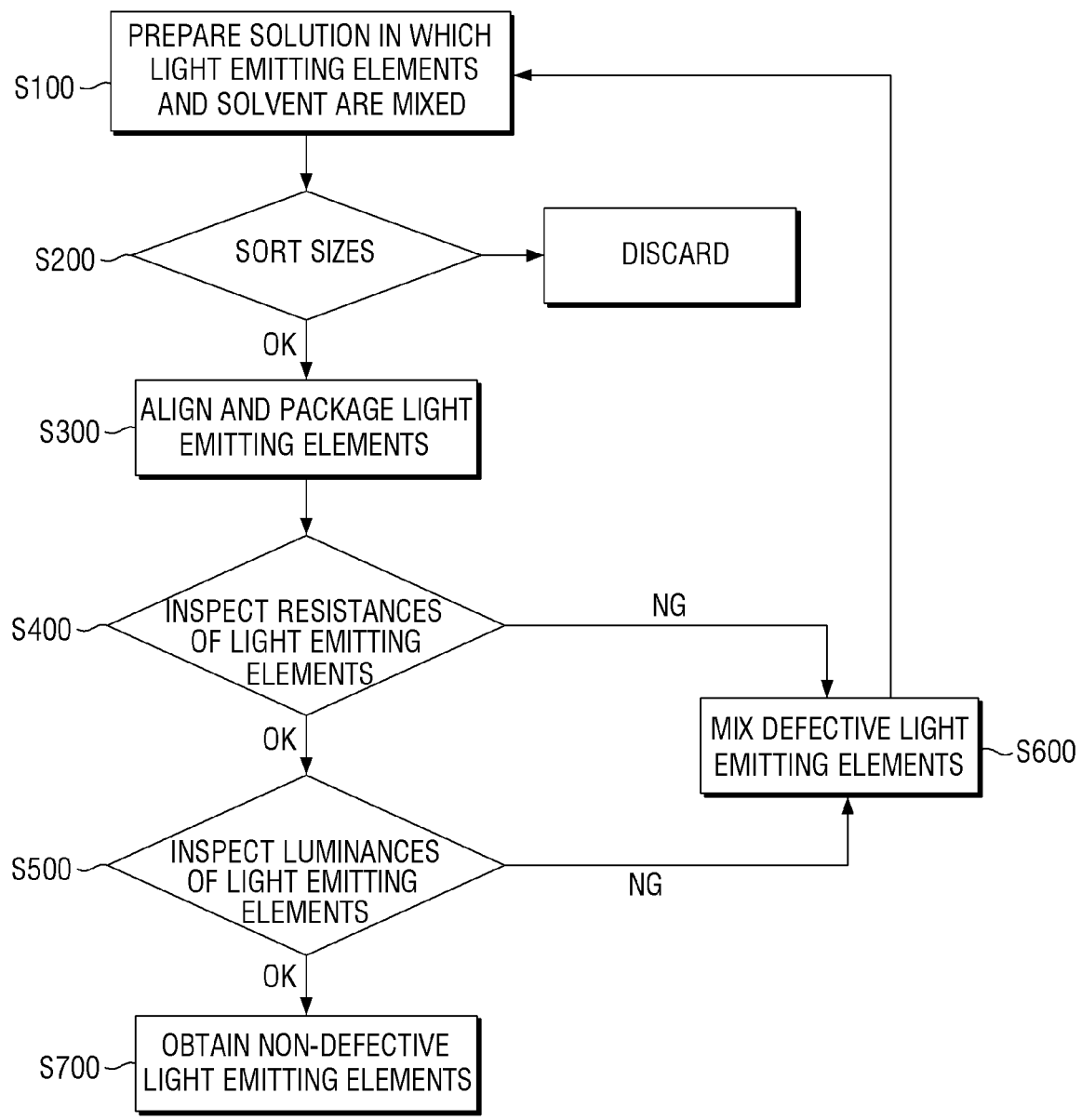
FIG. 12 is a flowchart illustrating a method of inspecting light emitting elements.
Figure 13:
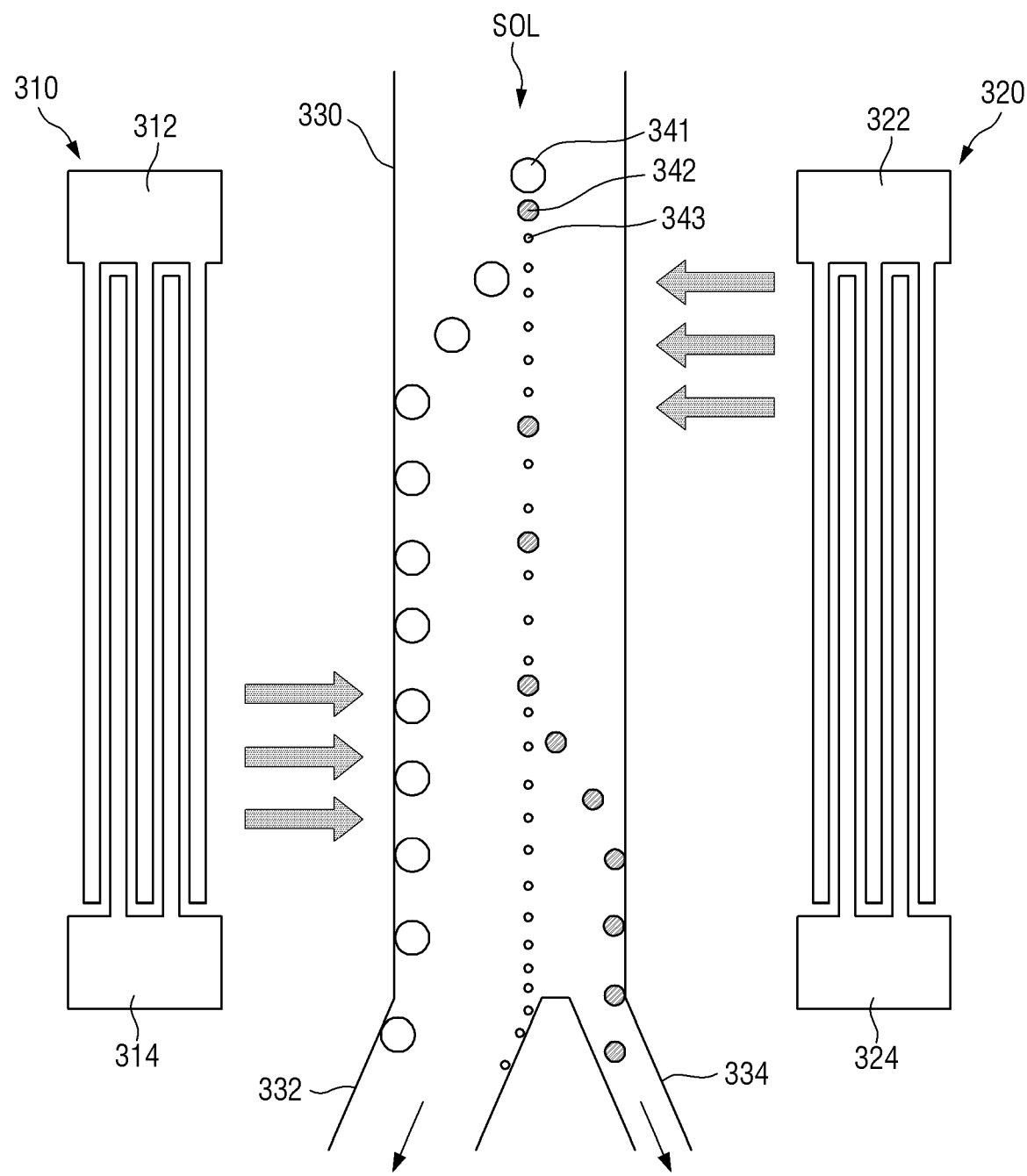
FIG. 13 is a schematic view illustrating a method of sorting sizes of light emitting elements.
Figure 14:
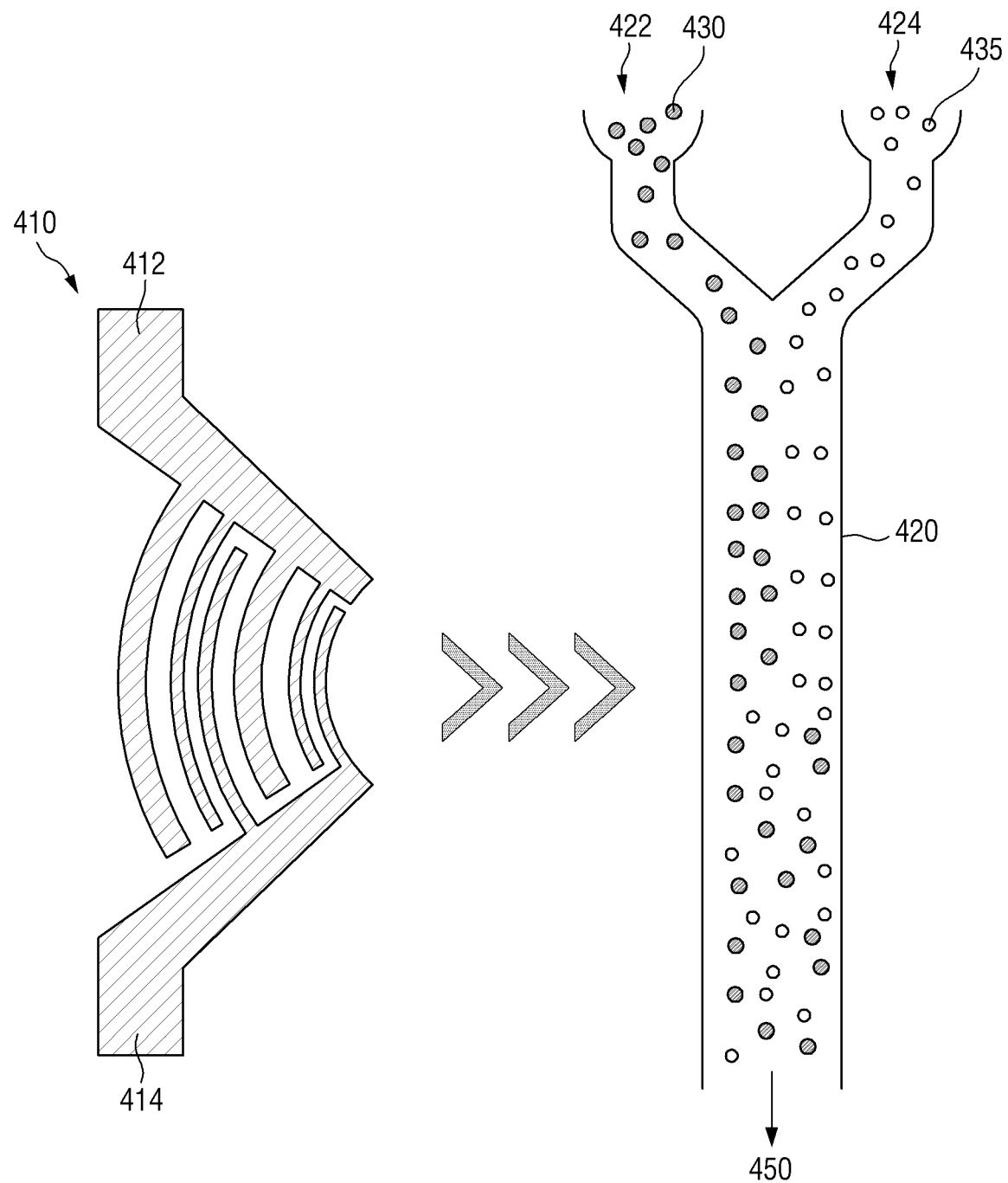
FIG. 14 is a schematic view illustrating a method of mixing light emitting elements.
Figure 15:
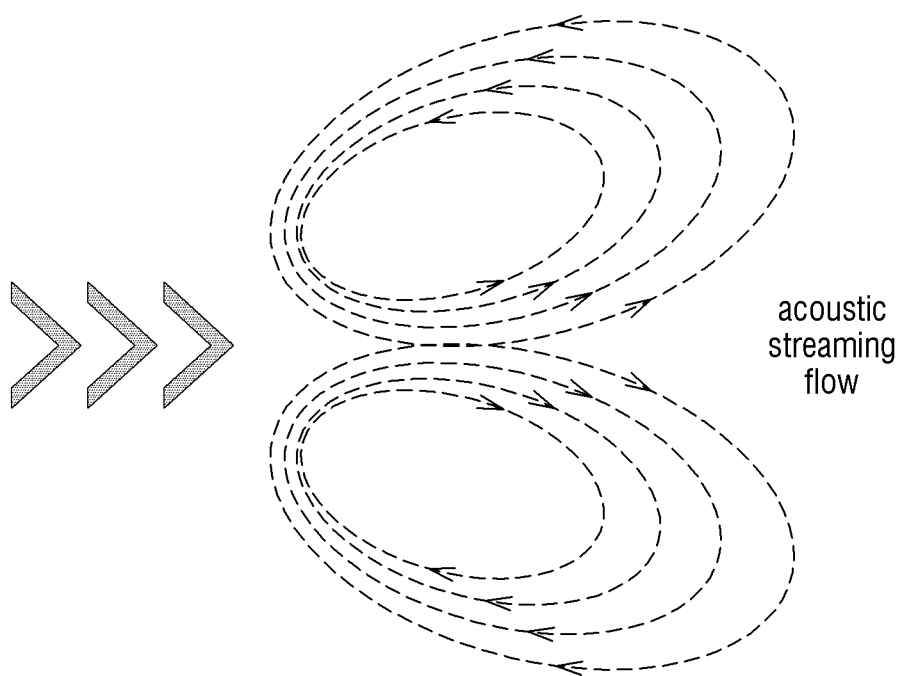
FIG. 15 is a schematic view of an acoustic streaming flow.

FIG. 12 is a flowchart illustrating a method of inspecting light emitting elements. FIG. 13 is a schematic view illustrating a method of sorting sizes of light emitting elements. FIG. 14 is a schematic view illustrating a method of mixing light emitting elements. FIG. 15 is a schematic view of an acoustic streaming flow. The following description will be given with reference to FIGS. 7 through 11 as well.

Referring to FIG. 12, a method of inspecting light emitting elements according to an embodiment may include preparing a solution in which light emitting elements and a solvent are mixed (operation S100), sorting sizes (e.g., lengths) of the light emitting elements (operation S200), aligning and packaging the light emitting elements (operation S300), inspecting resistances of the light emitting elements (operation S400), inspecting luminances of the light emitting elements (operation S500), mixing defective light emitting elements with a solution (operation S600), and obtaining non-defective light emitting elements (operation S700).

According to embodiments of the method, first, a solution SOL in which light emitting elements and a solvent are mixed is prepared. The light emitting elements may be structured as shown in FIG. 4 or FIG. 5, which are described above. The light emitting elements may have various suitable lengths. The solution SOL is mostly composed of the solvent and may include the light emitting elements in a set or predetermined content (e.g., amount).

Next, referring to FIGS. 12 and 13, the (e.g., lengths) of the light emitting elements may be sorted (operation S200). As described above, the light emitting elements mixed in the solution SOL may have various suitable sizes (e.g., lengths). The current operation is a process of sorting out light emitting elements having sizes (e.g., lengths) that can be used in a display device. In an embodiment, light emitting elements 341 through 343 may have large and small sizes (e.g., lengths).

In an embodiment, a device may be configured to include two oscillators 310 and 320 and a first flow pipe 330 between them and may sort sizes (e.g., lengths) of the light emitting elements 341 through 343 using a surface acoustic wave technique.

In the surface acoustic wave technique, two metal plates are alternately on a piezoelectric substrate, and an electrical signal is transmitted from one direction to generate surface acoustic waves on the piezoelectric substrate. The surface acoustic waves may have a set or predetermined frequency and sort size (e.g., lengths) of light emitting elements based on the principle that when a set or specific frequency acts on an object, the object is subjected to a force according to the size (e.g., length or particle diameter) of the object. In the surface acoustic wave technique, surface acoustic waves of a frequency having a wavenumber K greater than 1 may be emitted to an object. Here, the wavenumber K may be given by:

$$K = \frac{\pi d}{\lambda f}$$

where λ is a wavelength, f is a frequency, and d is a particle diameter of a particle.

The two oscillators 310 and 320 may include a first oscillator 310 and a second oscillator 320. The first oscillator 310 may be on a first side of the first flow pipe 330, and two first oscillation plates 312 and 314 may be alternately located to oscillate surface acoustic waves of a set or predetermined frequency. The second oscillator 320 may be on a second side of the first flow pipe 330, and two second oscillation plates 322 and 324 may be alternately located to oscillate surface acoustic waves of a set or predetermined frequency. The first oscillator 310 and the second oscillator 320 may be spaced apart from each other in the longitudinal direction of the first flow pipe 330. For example, the first oscillator 310 may be on an upper side of the first flow pipe 330, and the second oscillator 320 may be on a lower side of the first flow pipe 330.

In some embodiments, in order to sort the lengths of the light emitting elements 341 through 343, a solution SOL in which the light emitting elements 341 through 343 are mixed is injected into the first flow pipe 330. By transmitting an electrical signal to the second oscillator 320, surface acoustic waves of a set or specific frequency are emitted to the first flow pipe 330 to sort out first light emitting elements 341 having a set or predetermined length. For example, when surface acoustic waves having a frequency of 135 MHz are oscillated at a power of 0.85 W, the first light emitting elements 341 having a length of 5 μm among the light emitting elements in the first flow pipe 330 are subjected to a force, and thus, moved to the first side of the first flow pipe 330.

Next, by transmitting an electrical signal to the first oscillator 310, surface acoustic waves of a set or specific frequency are emitted to the first flow pipe 330 to sort out second light emitting elements 342 having a set or predetermined length. For example, when surface acoustic waves having a frequency of 170 MHz are oscillated at a power of 0.85 W, the second light emitting elements 342 having a length of 4 μm among the light emitting elements in the first flow pipe 330 are subjected to a force, and thus, moved to the second side of the first flow pipe 330. In addition, third light emitting elements 343 not affected by the surface acoustic waves of the set or predetermined frequency of each of the first oscillator 310 and the second oscillator 320 move along the first flow pipe 330 as they are (e.g., without or substantially without being moved by the surface acoustic waves).

A first drain pipe 332 and a second drain pipe 334 may branch from and be at an end of the first flow pipe 330. The first drain pipe 332 may cover from a center to the first side of the first flow pipe 330, and the second drain pipe 334 may cover the second side of the first flow pipe 330.

In an embodiment, to sort out light emitting elements having a length of 3.8 to 4.2 μm, an oscillator may oscillate surface acoustic waves having a frequency of 165 to 175 MHz. Here, the frequency may have an energy of 50 to 100 W.

The first and third light emitting elements 341 and 343 moving along the first side and center of the first flow pipe 330 may move to the first drain pipe 332, and the second light emitting elements 342 moving along the second side of the first flow pipe 330 may move to the second drain pipe 334. Ultimately, the second light emitting elements 342 may be sorted out. The first and third light emitting elements 341 and 343 moved to the first drain pipe 332 may be discarded, and the second light emitting elements 342 moved to the second drain pipe 334 may be collected and mixed with a solvent and used in a subsequent process.

Although a case where the second light emitting elements 342 are sorted out using two oscillators 310 and 320 has been described in the embodiment, the disclosure is not limited thereto. It is also possible to sort out light emitting elements having a set or predetermined size (e.g., length) by using one oscillator.

Next, referring to FIGS. 6, 7 and 12, the light emitting elements may be aligned and packaged (operation S300).

The light emitting elements sorted out previously may be mixed with a solvent and prepared again as a solution SOL. This solution SOL is injected into the inspection apparatus 200 illustrated in FIG. 6. The solution SOL injected into the flow path unit 210 flows down the flow path 211 of the flow path unit 210.

The solution SOL flowing along the flow path 211 may be aligned in the alignment unit 220. For example, when an electrical signal, that is, a current is transmitted to the first alignment electrode 251 and the second alignment electrode 252 in the first alignment area 220*a*, an electric field may be generated between the first alignment electrode 251 and the second alignment electrode 252. In the current embodiment, a DC signal may be transmitted to the first alignment electrode 251 and the second alignment electrode 252. When the DC signal is transmitted to the first alignment electrode 251 and the second alignment electrode 252, the light emitting elements 30 dispersed in the solution SOL may generate a dipole moment in response to the electric field. The light emitting elements 30 having the dipole moment may generate torque TDEP in response to the generated electric field. Accordingly, the light emitting elements 30 may be rotated. In addition, the light emitting elements 30 may be subjected to a dielectrophoretic force FDEP by the electric field. The light emitting elements 30 subjected to the dielectrophoretic force FDEP may move toward a position where the intensity of the electric field is relatively larger. Therefore, both ends of each light emitting element 30 may be rotated toward the first alignment electrode 251 and the second alignment electrode 252.

The solution SOL passing through the first alignment area 220*a* may continuously (e.g., substantially continuously) flow along the flow path 211 and then may be rotationally aligned again in the second alignment area 220*b*. In the second alignment area 220*b*, light emitting elements not rotationally aligned in the first alignment area 220*a* may be rotationally aligned. For example, as illustrated in FIG. 7, the light emitting layer 36 of each light emitting element 30 may be adjacent to the first alignment electrode 251.

Next, referring to FIGS. 8 through 12, resistances and luminances of the light emitting elements may be inspected (operations S400 and S500).

The light emitting elements 30 rotationally aligned through the alignment unit 220 may move along the flow path unit 210 and then be stacked and stored in the packaging unit 240 at an end of the inspection apparatus. When the solution SOL in which the light emitting elements 30 are mixed flows to the packaging unit 240 through the flow path unit 210, if the second filtering shutter 246 blocks the lower side of the storage part 241, the light emitting elements 30 are filtered out and stacked on the second filtering shutter 246, and the solution passes through the second filtering shutter 246. In addition, if the first filtering shutter 245 blocks the upper side of the storage part 241 after a set or predetermined time interval, the light emitting elements 30 may be blocked from entering the storage part 241.

Next, when the light emitting elements 30 are stacked and aligned in the storage part 241 of the packaging unit 240, the first inspection electrode 242 and the second inspection electrode 243 may be horizontally moved by the electrode moving parts 247. The horizontally moved first inspection electrode 242 may contact (e.g., physically contact) a side of each light emitting element 30, and the horizontally moved second inspection electrode 243 may contact (e.g., physically contact) the other side of each light emitting element 30. The first inspection electrode 242 and the second inspection electrode 243 in contact (e.g., physical contact) with both sides of each light emitting element 30 may inspect the resistance and luminance of the light emitting element 30. The light emitting elements 30 may be inspected in units of a plurality of light emitting elements 30 included in the storage part 241 of the packaging unit 240. With a reference resistance and luminance corresponding to one unit, light emitting elements 30 whose resistances and luminances are equal to or greater than the reference resistance and luminance may be determined to be non-defective. Thus, non-defective light emitting elements may be obtained (operation S700).

In addition, light emitting elements 30 whose resistances and luminances are less than the reference resistance and luminance may be determined to be defective and may be collected, and then a next operation may be performed.

Referring to FIGS. 12, 14 and 15, a first solution 422 containing light emitting elements 430 determined to be defective may be mixed with a second solution 424 containing new light emitting elements 435. Because non-defective light emitting elements can be mixed in the first solution 422 containing the defective light emitting elements 430, they may be reused.

In an embodiment, a device may be configured to include a third oscillator 410 and a second flow pipe 420 and may mix the first solution 422 and the second solution 424 using a surface acoustic wave technique. The third oscillator 410 may be composed of third oscillation plates 412 and 414 which are alternately located on a piezoelectric substrate. In the surface acoustic wave technique, when surface acoustic waves of a frequency having a wavenumber smaller than 1 is emitted to a liquid, an acoustic streaming flow is generated in the liquid. As illustrated in FIG. 15, the acoustic streaming flow is the flow of the liquid rotating in a plane. For example, the third oscillator 410 emits surface acoustic waves of a frequency having a wavenumber smaller than 1 to the second flow pipe 420, thereby generating an acoustic streaming flow in the second flow pipe 420. Accordingly, the defective light emitting elements 430 and the new light emitting elements 435 of the first solution 422 and the second solution 424 may be mixed. The mixed solution 450 thus obtained may be moved to the initial process, that is, the operation of sorting sizes (e.g., lengths) of light emitting elements (operation S200) and then used.

As described above, in the method of inspecting light emitting elements according to the embodiment, light emitting elements having a desired length can be obtained by sorting light emitting elements by size (e.g., length). In addition, in the method of inspecting light emitting elements according to the embodiment, because non-defective light emitting elements can be obtained, defects of a display device can be prevented (or a likelihood or degree of such defects can be reduced).

A method of manufacturing a display device using non-defective light emitting elements obtained using the method of inspecting light emitting elements will now be further described.

Figure 16:
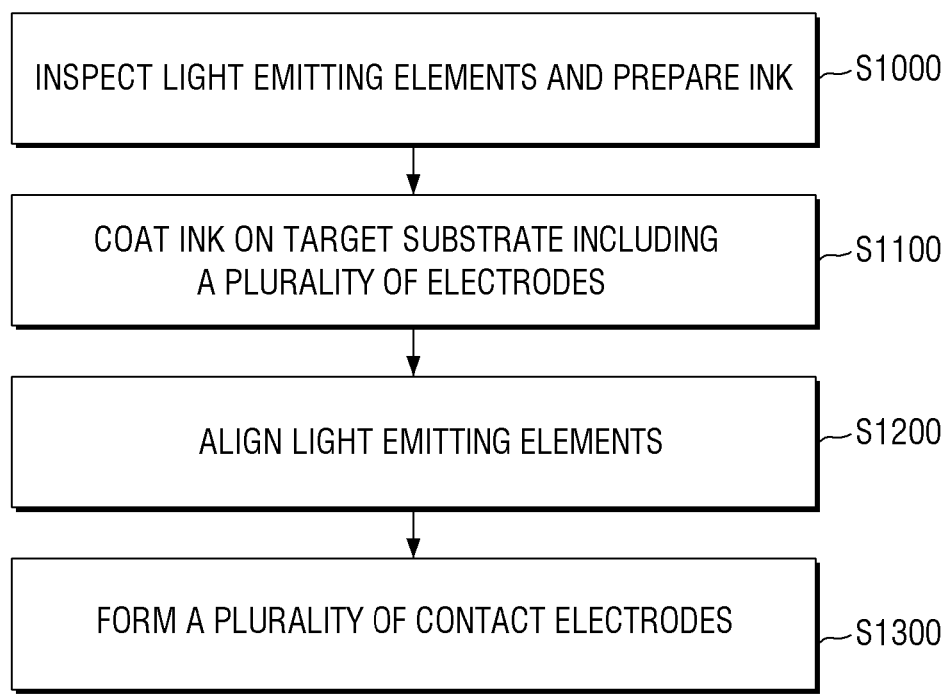
FIG. 16 is a flowchart illustrating a method of manufacturing a display device according to an embodiment.
Figure 17:
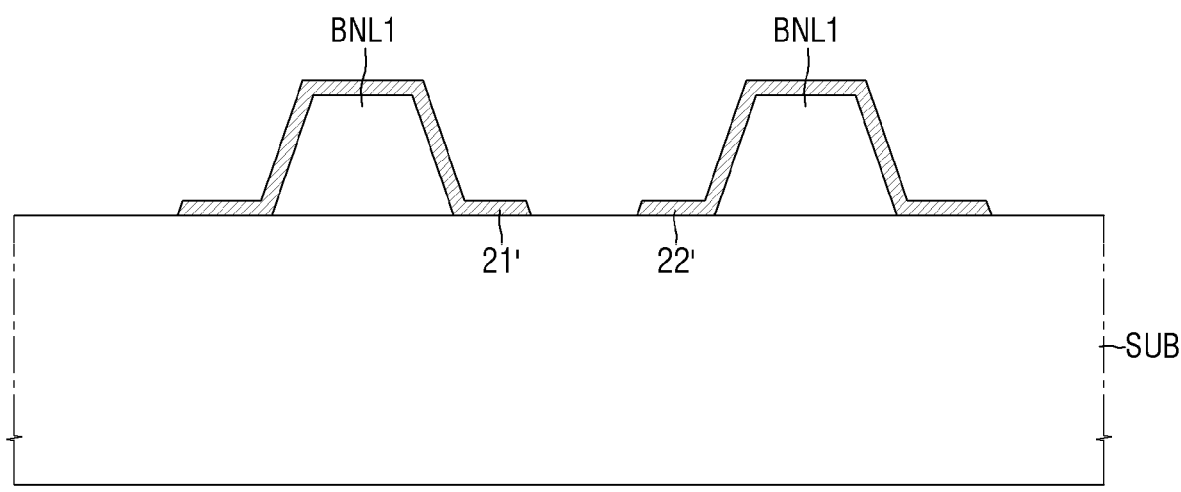
FIG. 17 is a cross-sectional view illustrating a part of a process of manufacturing a display device according to an embodiment.
Figure 18:
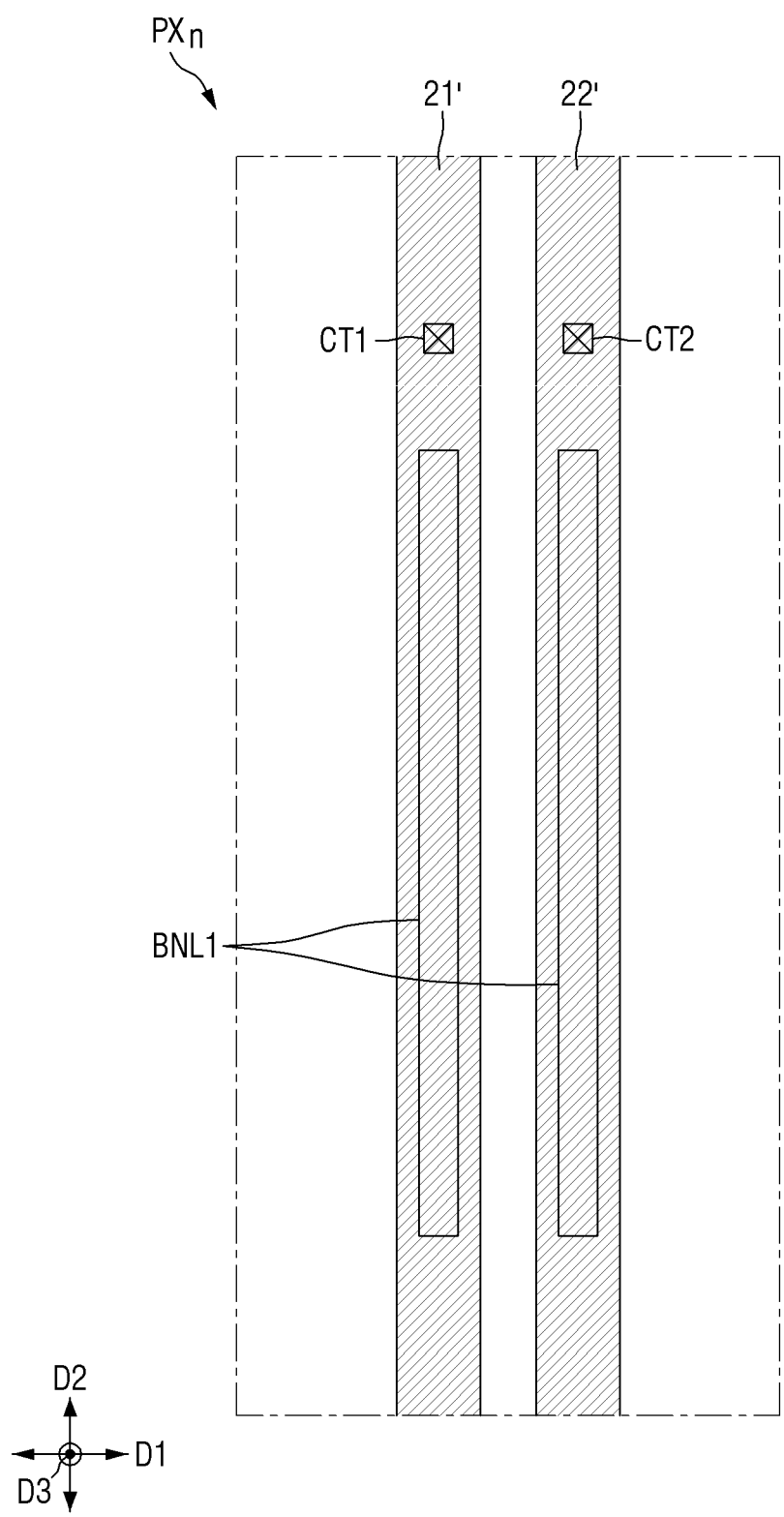
FIG. 18 is a plan view of a subpixel at one stage of the process of manufacturing a display device according to the embodiment.
Figure 19:
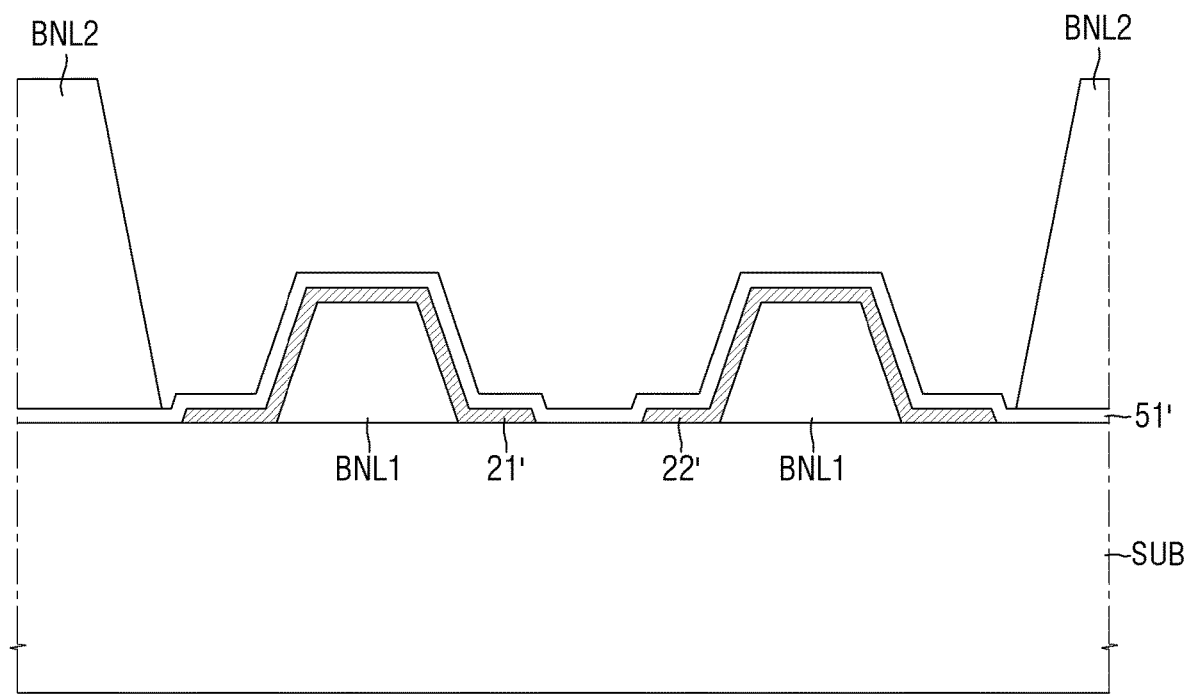
FIG. 19 is a cross-sectional view illustrating a part of the process of manufacturing a display device according to the embodiment.
Figure 20:
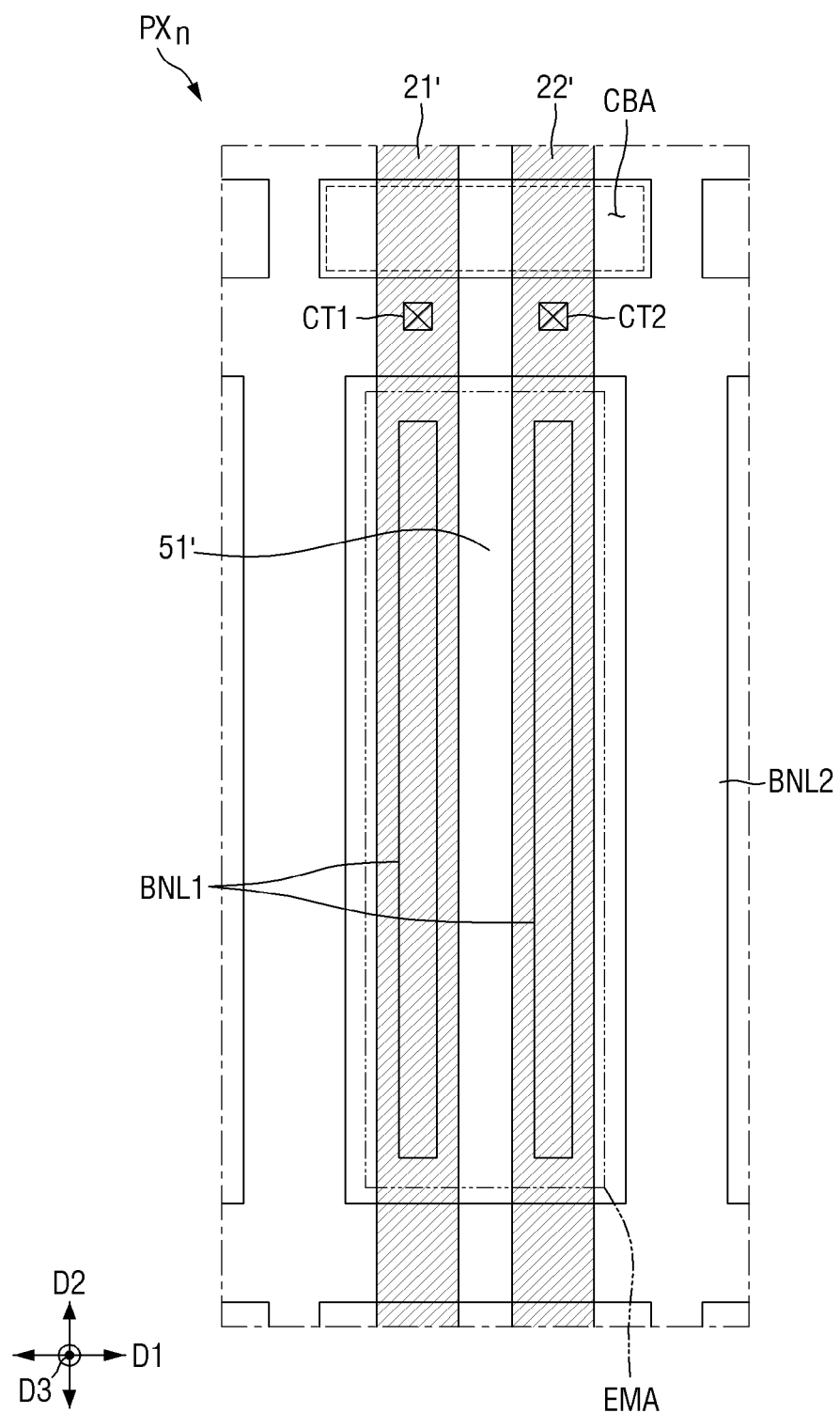
FIG. 20 is a plan view of the subpixel at one stage of the process of manufacturing a display device according to the embodiment.
Figure 21:
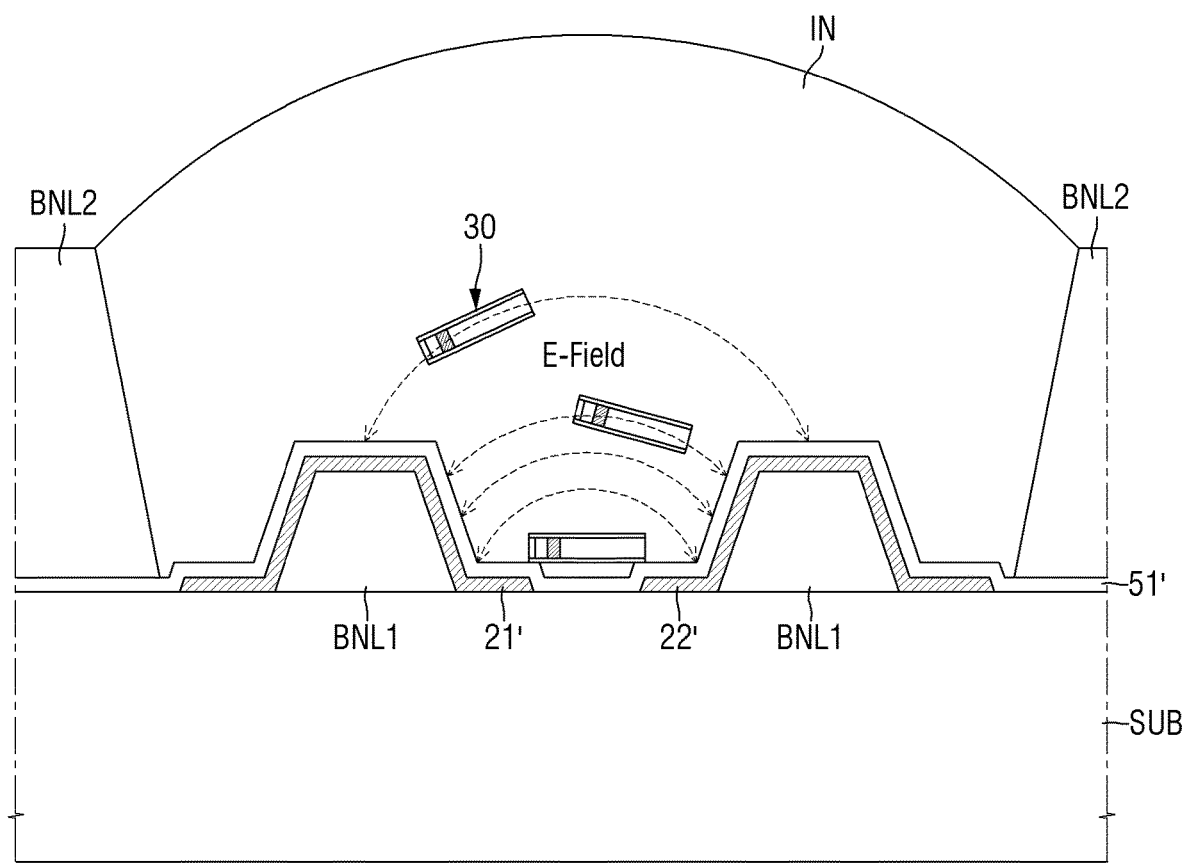
FIG. 21 is a cross-sectional view illustrating a part of the process of manufacturing a display device according to the embodiment.
Figure 22:
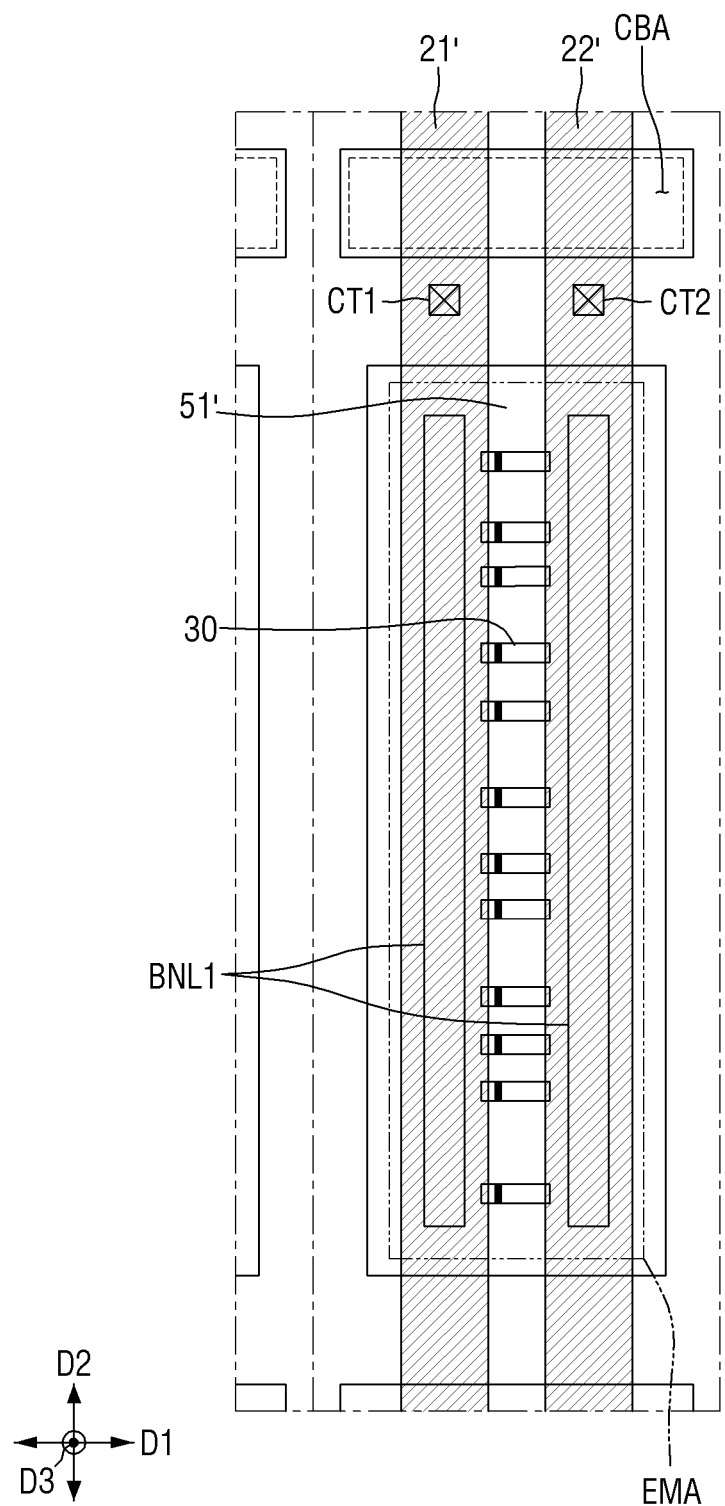
FIG. 22 is a plan view of the subpixel at one stage of the process of manufacturing a display device according to the embodiment.

FIG. 16 is a flowchart illustrating a method of manufacturing a display device according to an embodiment. FIG. 17 is a cross-sectional view illustrating a portion of a process of manufacturing a display device according to an embodiment. FIG. 18 is a plan view of a subpixel at one stage of the process of manufacturing a display device according to the embodiment. FIG. 19 is a cross-sectional view illustrating a portion of the process of manufacturing a display device according to the embodiment. FIG. 20 is a plan view of the subpixel at one stage of the process of manufacturing a display device according to the embodiment. FIG. 21 is a cross-sectional view illustrating a portion of the process of manufacturing a display device according to the embodiment. FIG. 22 is a plan view of the subpixel at one stage of the process of manufacturing a display device according to the embodiment.

Referring to FIG. 16, the method of manufacturing a display device according to the embodiment may include inspecting light emitting elements and preparing ink (operation S1000), coating the ink on a target substrate including a plurality of electrodes (operation S1100), aligning the light emitting elements (operation S1200), and forming a plurality of contact electrodes (operation S1300).

Referring to FIGS. 12 and 16, light emitting elements are inspected, and ink which is a solution containing light emitting elements determined to be non-defective is prepared (operation S1000). Because this operation has been described above with reference to FIGS. 12 through 15, a duplicative description thereof will not be repeated here.

Next, referring to FIGS. 16 through 18, the ink is coated on a target substrate SUB including a plurality of electrodes (operation S1100). First, the target substrate SUB is prepared. In some embodiments, the target substrate SUB may include a plurality of subpixels including circuit elements composed of a plurality of conductive layers and a plurality of insulating layers. For ease of description, the target substrate SUB will be illustrated and described below as including the above elements.

Next, a plurality of first banks BNL1 spaced apart from each other are formed on the target substrate SUB. The first banks BNL1 may protrude from an upper surface of the target substrate SUB. The arrangement of the first banks BNL1 is the same as described herein above. In addition, a first contact hole CT1 and a second contact hole CT2 exposing the circuit elements formed in the target substrate SUB are formed on the target substrate SUB.

Next, a first electrode layer 21' and a second electrode layer 22' are formed on the first banks BNL1. The first electrode layer 21' and the second electrode layer 22' extend in a second direction D2. The first electrode layer 21' and the second electrode layer 22' may be extended in the second direction D2 to other subpixels during the manufacturing process of the display device 10. After light emitting elements 30 are placed in a subsequent process, a process of cutting the first electrode layer 21' and the second electrode layer 22' in a cut area CBA of each subpixel PXn may be performed to form a first electrode 21 and a second electrode 22.

Next, referring to FIGS. 19 and 20, a first insulating material layer 51' is formed to cover the first electrode layer 21' and the second electrode layer 22', and a second bank BNL2 is formed on the first insulating material layer 51' to surround an emission area EMA and the cut area CBA of each subpixel PXn. The first insulating material layer 51' may be entirely on the target substrate SUB and may cover the electrode layers 21' and 22'. The first insulating material layer 51' may be partially removed in a subsequent process to expose upper surfaces of the electrode layers 21' and 22', thereby forming a first insulating layer PAS1. The second bank BNL2 may be placed to surround each subpixel PXn to separate them from each other while separating the emission area EMA and the cut area CBA.

Next, referring to FIGS. 16, 21 and 22, the light emitting elements are aligned (operation S1200). For example, a plurality of light emitting elements 30 are placed between the first banks BNL1. The light emitting elements 30 may be placed on the first insulating material layer 51' such that both ends of each light emitting element 30 lie on the first electrode layer 21' and the second electrode layer 22', respectively. The light emitting elements 30 may be sprayed onto the target substrate SUB in a state where they are dispersed in ink IN. In an exemplary embodiment, the light emitting elements 30 may be dispersed in the ink IN containing a solvent and may be sprayed onto the target substrate SUB in a printing process using an inkjet printing device described above. The ink IN sprayed through the inkjet printing device may settle in an area surrounded by the second bank BNL2. The second bank BNL2 may prevent or reduce overflow of the ink IN to other subpixels PXn.

Next, when the ink IN containing the light emitting elements 30 is sprayed, an electrical signal is transmitted to each electrode layer 21' or 22', thereby placing the light emitting elements 30 on the first insulating material layer 51'.

For example, when an electrical signal, that is, a current is transmitted to the electrode layers 21' and 22', an electric field may be generated on the electrode layers 21' and 22'. When a DC signal is transmitted to any one of the electrode layers 21' and 22', the light emitting elements 30 dispersed in the ink IN generate a dipole moment. The light emitting elements 30 having the dipole moment generate torque TDEP in response to the generated electric field. Accordingly, the light emitting elements 30 are aligned. In addition, the light emitting elements 30 may be subjected to a dielectrophoretic force FDEP by the electric field. The light emitting elements 30 subjected to the dielectrophoretic force FDEP may move toward a position where the intensity of the electric field is great. Therefore, both ends of each light emitting element 30 may lie on the electrode layers 21' and 22'.

As illustrated in FIGS. 21 and 22, the light emitting elements 30 dispersed in the ink IN are placed such that an end of each light emitting element 30 lies on the first electrode layer 21' and the other end lies on the second electrode 22'. Then, the solvent is removed from the ink IN sprayed onto the target substrate SUB. Accordingly, the positions of the light emitting elements 30 may be fixed.

Next, referring to FIGS. 2, 3 and 16, a plurality of contact electrodes are formed (operation S1300). For example, the first insulating layer PAS1 is formed by partially removing the first insulating material layer 51' to expose the upper surfaces of the first electrode layer 21' and the second electrode layer 22'. The first insulating layer PAS1 may include openings OP partially exposing the electrode layers 21' and 22', respectively. The upper surfaces of the electrode layers 21' and 22' exposed through the openings OP may contact the contact electrodes CNE1 and CNE2 described herein above and below.

Next, the process of cutting the first electrode layer 21' and the second electrode layer 22' in the cut area CBA is performed to form the first electrode 21 and the second electrode 22. Then, a first contact electrode CNE1 and a second contact electrode CNE2 respectively contacting (e.g., physically contacting) both ends of each light emitting element 30 may be formed on the target substrate SUB. Then, a third insulating layer PAS3 and a fourth insulating layer PAS4 may be formed on the first contact electrode CNE1 and the second contact electrode CNE2, thereby manufacturing the display device 10.

In an apparatus for inspecting light emitting elements, a method of inspecting light emitting elements using the apparatus, and a method of manufacturing a display device using the apparatus according to embodiments, light emitting elements having a suitable or desired length can be obtained by sorting light emitting elements by length.

In addition, in a method of inspecting light emitting elements and a method of manufacturing a display device according to an embodiment, because non-defective light emitting elements can be obtained, defects of a display device can be prevented (or a likelihood or degree of such defects can be reduced).

However, the effects of the embodiments are not restricted to the one set forth herein. The above and other effects of the embodiments will become more apparent to one of daily skill in the art to which the embodiments pertain by referencing the claims.

In concluding the detailed description, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation.

What is claimed is:

1. An apparatus for inspecting light emitting elements, the apparatus comprising:
   a flow path unit extending in one direction and comprising a flow path along which a solution in which light emitting elements are mixed moves;
   at least one alignment unit to which the flow path extends from at least a portion of the flow path unit;
   a packaging unit at an end of the flow path unit and in which the light emitting elements are stacked; and
   a plurality of alignment electrodes on an outer surface of the alignment unit,
   wherein the alignment unit comprises a first alignment area and a second alignment area, and the first alignment area and the second alignment area are spaced apart from each other with the flow path unit in between,
   wherein the plurality of alignment electrodes is disposed to extend the flow path unit, the first alignment area and the second alignment area in one body.

2. The apparatus of claim 1, wherein the flow path unit comprises an inlet at an upper end of the flow path unit and an outlet at a lower end of the flow path unit, and each of the inlet and the outlet has a rectangular planar shape.

3. The apparatus of claim 2, wherein a planar shape of the flow path is the same as the planar shape of the inlet or the outlet.

4. The apparatus of claim 1, wherein a diameter of the first alignment area or the second alignment area is greater than a length of a long axis of each of the light emitting elements.

5. The apparatus of claim 1, wherein the packaging unit comprises:
   a storage part which extends from the flow path unit;
   a plurality of inspection electrodes on two sides inside the storage part;
   filtering shutters at upper and lower ends of the storage part, respectively; and
   electrode moving parts which are outside the flow path unit and move the inspection electrodes.

6. The apparatus of claim 5, wherein the inspection electrodes are spaced apart from the alignment electrodes.

7. The apparatus of claim 5, wherein the filtering shutters comprise a first filtering shutter at the upper end of the storage part and a second filtering shutter at the lower end of the storage part, and the first filtering shutter and the second filtering shutter open or close the upper end and the lower end of the storage part, respectively.

8. A method of inspecting light emitting elements using an apparatus for inspecting the light emitting elements, the apparatus comprising a flow path unit extending in one direction and comprising a flow path, at least one alignment unit to which the flow path extends from at least a portion of the flow path unit, a packaging unit at an end of the flow path unit and in which light emitting elements are stacked and a plurality of alignment electrodes on an outer surface of the alignment unit, the method comprising:
preparing a solution in which the light emitting elements and a solvent are mixed;
sorting the light emitting elements by length;
injecting the solution into the inspection apparatus and aligning the light emitting elements using the alignment unit;
aligning the aligned light emitting elements using the packaging unit; and
determining whether the light emitting elements are defective by inspecting resistances and luminances of the light emitting elements.

9. The method of claim 8, wherein light emitting elements having a set length are sorted out using a surface acoustic wave technique.

10. The method of claim 9, wherein the length of each of the light emitting elements is in a range of 3.8 to 4.2 μm.

11. The method of claim 10, wherein surface acoustic waves have a frequency band in a range of 165 to 175 MHz.

12. The method of claim 8, wherein the alignment unit rotates and aligns the light emitting elements by applying an electrical signal to the alignment electrodes to generate an electric field.

13. The method of claim 12, wherein the packaging unit comprises a plurality of inspection electrodes and electrode moving parts which horizontally move the inspection electrodes, and the inspection electrodes are brought into contact with both sides of each light emitting element aligned in the packaging unit by the electrode moving parts to measure the resistances and luminances of the light emitting elements.

14. The method of claim 8, wherein the light emitting elements are obtained when the light emitting elements are determined to be non-defective in resistance and luminance, and
wherein the light emitting elements are re-injected into the solution when the light emitting elements are determined to be defective in resistance or luminance.

15. The method of claim 14, wherein the light emitting elements re-injected into the solution are mixed again using the surface acoustic wave technique.

16. The method of claim 15, wherein the solution in which the re-injected light emitting elements are mixed repeat the sorting of the light emitting elements by length, the injecting of the solution into the inspection apparatus and the aligning of the light emitting elements using the alignment unit, the aligning of the aligned light emitting elements using the packaging unit, and the determining of whether the light emitting elements are defective by inspecting the resistances and luminances of the light emitting elements.

17. A method of manufacturing a display device using an apparatus for inspecting light emitting elements, the apparatus comprising a flow path unit extending in one direction and comprising a flow path, at least one alignment unit to which the flow path extends from at least a portion of the flow path unit, a packaging unit which is at an end of the flow path unit and in which light emitting elements are stacked and a plurality of alignment electrodes on an outer surface of the alignment unit, and the method comprising:
preparing a solution in which the light emitting elements and a solvent are mixed;
sorting the light emitting elements by length;
injecting the solution into the inspection apparatus and aligning the light emitting elements using the alignment unit;
aligning the aligned light emitting elements using the packaging unit;
determining whether the light emitting elements are defective by inspecting resistances and luminances of the light emitting elements and obtaining light emitting elements determined to be non-defective;
preparing an ink by mixing the light emitting elements determined to be non-defective with the solvent;
coating the ink on a target substrate comprising a plurality of subpixels and aligning the light emitting elements; and
forming a plurality of contact electrodes on the light emitting elements.

18. The method of claim 17, wherein the aligning of the light emitting elements comprises:
forming a first electrode layer and a second electrode layer on the target substrate;
coating the ink on the target substrate using an inkjet printing device; and
aligning the light emitting elements by generating an electric field on the target substrate.

19. The method of claim 17, wherein the forming of the contact electrodes on the light emitting elements comprises:
forming a first insulating layer on the target substrate; and
forming a first contact electrode and a second contact electrode which respectively contact both ends of each light emitting element.

* * * * *